(12) United States Patent
Yuan et al.

(10) Patent No.: US 11,875,713 B2
(45) Date of Patent: Jan. 16, 2024

(54) OVERCURRENT PROTECTION CIRCUIT, DISPLAY APPARATUS AND DRIVER CIRCUIT THEREOF, AND OVERCURRENT PROTECTION METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xianfeng Yuan, Beijing (CN); Jianjun Wang, Beijing (CN); Xiaoshi Liu, Beijing (CN); Junbo Xu, Beijing (CN); Rui Wang, Beijing (CN); Yuanyuan Liu, Beijing (CN); Xuanxuan Qiao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,288

(22) PCT Filed: May 17, 2021

(86) PCT No.: PCT/CN2021/094150
§ 371 (c)(1),
(2) Date: May 31, 2022

(87) PCT Pub. No.: WO2021/254062
PCT Pub. Date: Dec. 23, 2021

(65) Prior Publication Data
US 2022/0415225 A1 Dec. 29, 2022

(30) Foreign Application Priority Data
Jun. 17, 2020 (CN) .......................... 202010555560.9

(51) Int. Cl.
*G09G 3/00* (2006.01)
*H03H 3/08* (2006.01)

(52) U.S. Cl.
CPC ............... *G09G 3/006* (2013.01); *H03H 3/08* (2013.01); *G09G 2310/0294* (2013.01); *G09G 2310/08* (2013.01); *G09G 2330/04* (2013.01)

(58) Field of Classification Search
CPC ..................................................... G09G 3/006
See application file for complete search history.

(56) References Cited

U.S. PATENT DOCUMENTS

| 2010/0220079 A1 | 9/2010 | Bang et al. |
| 2015/0194800 A1 | 7/2015 | Kim et al. |

(Continued)

FOREIGN PATENT DOCUMENTS

| CN | 102208800 A | 10/2011 |
| CN | 105448260 A | 3/2016 |

(Continued)

OTHER PUBLICATIONS

Office Action for the Chinese Patent Application No. 202010555560.9 issued by the Chinese Patent Office dated Mar. 10, 2021.

*Primary Examiner* — Gustavo Polo
(74) *Attorney, Agent, or Firm* — IP & T GROUP LLP

(57) ABSTRACT

An overcurrent protection circuit includes: a sampling sub-circuit configured to acquire gate input signals, select a gate input signal with a voltage value greater than a first preset voltage value as a sample gate input signal, generate a first control signal according to the sample gate input signal, and output the first control signal; a delay determination sub-circuit configured to receive the first control signal, delay the first control signal for a first preset time, determine whether a voltage value of the first control signal after delay is less than a voltage value of the first control signal before the delay, and if not, output a counting signal; and a counting (Continued)

control sub-circuit configured to receive the counting signal, perform counting according to the counting signal, and if a counted number reaches a preset number, output a second control signal.

18 Claims, 9 Drawing Sheets

(56) References Cited

U.S. PATENT DOCUMENTS

2017/0206847 A1   7/2017  Park et al.
2018/0308448 A1  10/2018  Lee et al.
2020/0020265 A1   1/2020  Lee

FOREIGN PATENT DOCUMENTS

| | | |
|---|---|---|
| CN | 106297702 A | 1/2017 |
| CN | 107394753 A | 11/2017 |
| CN | 107508252 A | 12/2017 |
| CN | 108599096 A | 9/2018 |
| CN | 109064985 A | 12/2018 |
| CN | 110718197 A | 1/2020 |
| CN | 111627376 A | 9/2020 |

OVERCURRENT PROTECTION CIRCUIT, DISPLAY APPARATUS AND DRIVER CIRCUIT THEREOF, AND OVERCURRENT PROTECTION METHOD

CROSS-REFERENCE TO RELATED APPLICATIONS

This application is a national phase entry under 35 USC 371 of International Patent Application No. PCT/CN2021/094150, filed on May 17, 2021, which claims priority to Chinese Patent Application No. 202010555560.9, filed on Jun. 17, 2020, which are incorporated herein by reference in their entirety.

TECHNICAL FIELD

The present disclosure relates to the field of display technologies, and in particular, to an overcurrent protection circuit, a display apparatus and a driver circuit thereof, and an overcurrent protection method.

BACKGROUND

In a display apparatus, a timing controller is used to receive a display signal input by a system board, process the display signal and generate operation timings of a is source driver circuit and a gate driver circuit, so that the source driver circuit and the gate driver circuit drive a display panel to display an image according to the received signals. In a case where the display signal is abnormal, the operation timings of the source driver circuit and the gate driver circuit generated by the timing controller according to the display signal are also abnormal, so that normal display of the display apparatus is affected, and the display panel is damaged.

SUMMARY

In an aspect, an overcurrent protection circuit is provided. The overcurrent protection circuit is configured to continuously detect a plurality of gate input signals input to a gate driver circuit. The overcurrent protection circuit includes a sampling sub-circuit, a delay determination sub-circuit, and a counting control sub-circuit.

The sampling sub-circuit is configured to acquire the plurality of gate input signals, select a gate input signal with a voltage value greater than a first preset voltage value in the plurality of gate input signals as a sample gate input signal, generate a first control signal according to the sample gate input signal, and output the first control signal. The first preset voltage value is a critical voltage value at which a transition between a normal state and an overcurrent state of a voltage of a gate input signal occurs.

The delay determination sub-circuit is coupled to the sampling sub-circuit. The to delay determination sub-circuit is configured to receive the first control signal output by the sampling sub-circuit, delay the first control signal for a first preset time, and determine whether a voltage value of the first control signal after delay is less than a voltage value of the first control signal before the delay, and if the voltage value of the first control signal after the delay is not less than the voltage value of the first control signal before the delay, output a counting signal.

The counting control sub-circuit is coupled to the delay determination sub-circuit. The counting control sub-circuit is configured to receive the counting signal output by the delay determination sub-circuit, perform counting according to the counting signal, and if a counted number reaches a preset number, output a second control signal. The second control signal is used for cutting off of inputting of a signal from a system board of a display apparatus to a driver circuit of the display apparatus.

In some embodiments, the sampling sub-circuit includes a signal selection unit. The signal selection unit is configured to receive the plurality of gate input signals, and select the gate input signal with the voltage value greater than the first preset voltage value in the plurality of gate input signals as the sample gate input signal.

In some embodiments, the sampling sub-circuit further includes a signal processing unit coupled to the signal selection unit. The signal processing unit is configured to receive the sample gate input signal output by the signal selection unit, perform de-interference processing and amplification processing on the sample gate input signal, generate the first control signal according to the de-interfered and amplified sample gate input signal and a second preset voltage value, and output the first control signal. The second preset voltage value is related to an amplification factor for performing the de-interference processing and the amplification processing on the sample gate input signal.

In some embodiments, the signal processing unit includes a noise reduction sub-unit, an amplification sub-unit and a comparison sub-unit. The noise reduction subunit is configured to receive the sample gate input signal output by the signal selection unit, perform the de-interference processing on the sample gate input signal, and output the de-interfered sample gate input signal. The amplification sub-unit is coupled to the noise reduction sub-unit, and the amplification sub-unit is configured to receive the de-interfered sample gate input signal output by the noise reduction sub-unit, perform the amplification processing on the de-interfered sample gate input signal, and output the de-interfered and amplified sample gate input signal. The comparison sub-unit is coupled to the amplification sub-unit, and the comparison sub-unit is configured to receive the de-interfered and amplified sample gate input signal output by the amplification sub-unit, generate the first control signal according to the de-interfered and amplified sample gate input signal and the second preset voltage value, and output the first control signal.

In some embodiments, the signal selection unit is configured to receive the plurality of gate input signals, select a gate input signal with a greatest voltage value in the plurality of gate input signals, compare the voltage value of the selected gate input signal with the first preset voltage value, and if the voltage value of the selected gate input signal is greater than the first preset voltage value, use the selected gate input signal as the sample gate input signal.

In some embodiments, a number of the plurality of gate input signals is x, the signal selection unit includes n stages of selector groups, and a selector group in an i-th stage includes $2^{(n-i)}$ selectors; and x is a positive integer greater than or equal to 3, n is a positive integer greater than or equal to 2, and i a value in a positive integer set of [1, n] in sequence.

Each selector has two input terminals and one output terminal. Two input terminals of a selector in a selector group in an (i+1)-th stage are coupled to output terminals of two selectors in the selector group in the i-th stage, respectively. A selector group in a first stage is configured to acquire the plurality of gate input signals, and each selector in the first-stage selector group is configured to receive two gate input signals in the plurality of gate input signals, and output a gate input signal with a greater voltage value in the received two gate input signals in the plurality of gate input signals.

The selector group in the (i+1)-th stage is configured to receive gate input signals output by the selector group in the i-th stage, and each selector in the selector group in the (i+1)-th stage is configured to receive two gate input signals in the gate input signals output by the selector group in the i-th stage, and output a gate input signal with a greater voltage value in the received two gate input signals in the gate input signals output by the selector group in the i-th stage. A selector in a selector group in an n-th stage is configured to receive two gate input signals output by a selector group in an (n−1)-th stage, select a gate input signal with a greater voltage value in the two gate input signals output by the selector group in the (n−1)-th stage, compare a voltage value of the selected gate input signal with the greater voltage value output by the selector group in the (n−1)-th stage with the first preset voltage value, and if the voltage value of the selected gate input signal with the greater voltage value output by the selector group in the (n−1)-th stage is greater than the first preset voltage value, use the selected gate input signal with the greater voltage value output by the selector group in the (n−1)-th stage as the sample gate input signal.

In some embodiments, the signal selection unit further includes a switch control sub-unit. The switch control sub-unit 11 is coupled to the selector group in the first stage, and is configured to control each selector in the selector group in the first stage to be turned on or off.

In some embodiments, the delay determination sub-circuit includes a delay unit and a determination unit.

The delay unit is configured to receive the first control signal output by the sampling sub-circuit, delay the first control signal for the first preset time, and output the delayed first control signal. The determination unit is coupled to the delay unit, and the determination unit is configured to receive the first control signal output by the sampling sub-circuit and the delayed first control signal output by the delay unit, determine whether the voltage value of the first control signal before the delay is equal to the voltage value of the first control signal after the delay, and if the voltage value of the first control signal before the delay is equal to the voltage value of the first control signal after the delay, output the counting signal.

In some embodiments, the first preset time is in a range of 3 μs to 5 μs, inclusive.

In some embodiments, the counting control sub-circuit is further configured to: if the counted number does not reach the preset number, determine whether the counted number is increased within a second preset time after a dock cycle in which it is determined that the counted number does not reach the preset number, and if the counted number is not increased within the second preset time after the clock cycle in which it is determined that the counted number does not reach the preset number, reset the counted number to zero.

In some embodiments, the overcurrent protection circuit is further configured to detect the plurality of gate input signals once in each clock cycle under control of a detection timing signal. The second preset time is another clock cycle.

In some embodiments, the counting control sub-circuit is further configured to, if the counted number reaches the preset number, output a third control signal, the third control signal being used for cutting off of inputting of a signal from a signal source to the system board.

In some embodiments, the counting control sub-circuit includes a counting unit and a control unit.

The counting unit is configured to receive the counting signal output by the delay determination sub-circuit, and perform the counting according to the counting signal. The control unit is coupled to the counting unit, and the control unit is configured to store the counted number, and if the counted number reaches the preset number, output the second control signal.

In another aspect, a driver circuit of a display apparatus is provided. The driver circuit includes a power supply circuit, a timing controller and the overcurrent protection circuit.

The power supply circuit is coupled to the system board of the display apparatus, the timing controller and the overcurrent protection circuit. The power supply circuit is configured to receive a power supply signal output by the system board, and supply power to the timing controller and the overcurrent protection circuit according to the power supply signal.

The timing controller is further coupled to the system board, and the timing controller is configured to receive a display signal output by the system board, and generate the plurality of gate input signals for input to the gate driver circuit of the display apparatus according to the display signal.

The overcurrent protection circuit is further coupled to the timing controller. The power supply circuit is further configured to receive the second control signal output by the overcurrent protection circuit, and stop receiving the power supply signal output by the system board under control of the second control signal.

In some embodiments, the driver circuit further includes a source driver circuit. The source driver circuit is coupled to the power supply circuit and the timing controller. The timing controller is further configured to generate a plurality of source input signals for input to the source driver circuit according to the display signal. The source driver circuit is configured to receive the plurality of source input signals, and generate data signals according to the plurality of source input signals.

In yet another aspect, a display apparatus is provided. The display apparatus includes the driver circuit, the system board and a display panel. The system board is coupled to the power supply circuit and the timing controller in the driver circuit, and the system board is configured to output the power supply signal and the display signal.

The display panel is coupled to the driver circuit. The display panel includes the gate driver circuit, and the gate driver circuit is coupled to the timing controller and the power supply circuit in the driver circuit. The gate driver circuit is configured to receive the plurality of gate input signals output by the timing controller, generate gate scanning signals according to the plurality of gate input signals, and output the gate scanning signals.

In some embodiments, in a case where the overcurrent protection circuit in the driver circuit is further configured to output the third control signal, the system board is further coupled to the overcurrent protection circuit in the driver circuit. The system board is further configured to receive the third control signal, and stop receiving a signal output by a signal source under control of the third control signal.

In yet another aspect, an overcurrent protection method is provided, which is applied to the display apparatus. The overcurrent protection method includes: outputting, by the system board of the display apparatus, the power supply signal and the display signal to the driver circuit of the display apparatus; receiving, by the power supply circuit in the driver circuit, the power supply signal, and supplying, by the power supply circuit in the driver circuit, power to the timing controller and the overcurrent protection circuit in the driver circuit; receiving, by the timing controller, the display signal, and generating, by the timing controller, the plurality of gate input signals for input to the gate driver circuit of the display apparatus according to the display signal; acquiring, by the overcurrent protection circuit, the plurality of gate input signals, continuously detecting, by the overcurrent protection circuit, the plurality of gate input signals, and if overcurrent of a gate input signal is detected, outputting, by the overcurrent protection circuit, the second control signal to the power supply circuit; and receiving, by the power supply circuit, the second control signal, and the power supply circuit stopping receiving the power supply signal output by the system board under control of the second control signal In some embodiments, the overcurrent protection method further includes: continuously detecting, by the overcurrent protection circuit, the plurality of gate input signals, and if the overcurrent of the gate input signal is detected, outputting, by the overcurrent protection circuit, a third control signal to the system board; and receiving, by the system board, the third control signal, and the system board stopping receiving a signal input by a signal source under control of the third control signal.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1A:
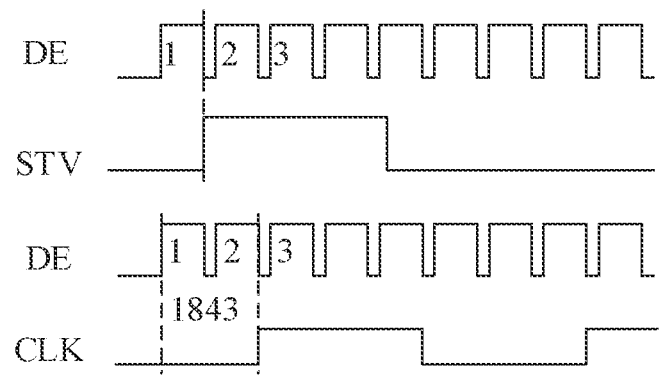
FIG. 1A is a diagram showing timings of a CLK signal and an STV signal that are generated according to a DE signal with normal phase.

Technical solutions in some embodiments of the present disclosure will be described clearly and completely with reference to the accompanying drawings below.

However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the term such as "one embodiment", "some embodiments", "exemplary embodiment", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, features defined with "first" and "second" may explicitly or implicitly include one or more of the features. In the description of the embodiments of the present disclosure, the term "a plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

As used herein, depending on the context, the term "if" is optionally construed as "when", "in a case where", "in response to determining" or "in response to detecting". Similarly, depending on the context, the phrase "if it is determined that" or "if [a stated condition or event] is detected" is optionally construed as "in a case where it is determined that", "in response to determining that", "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action "based on" one or more of the stated conditions or values may, in practice, be based on additional conditions or values exceeding those stated.

Figure 2:
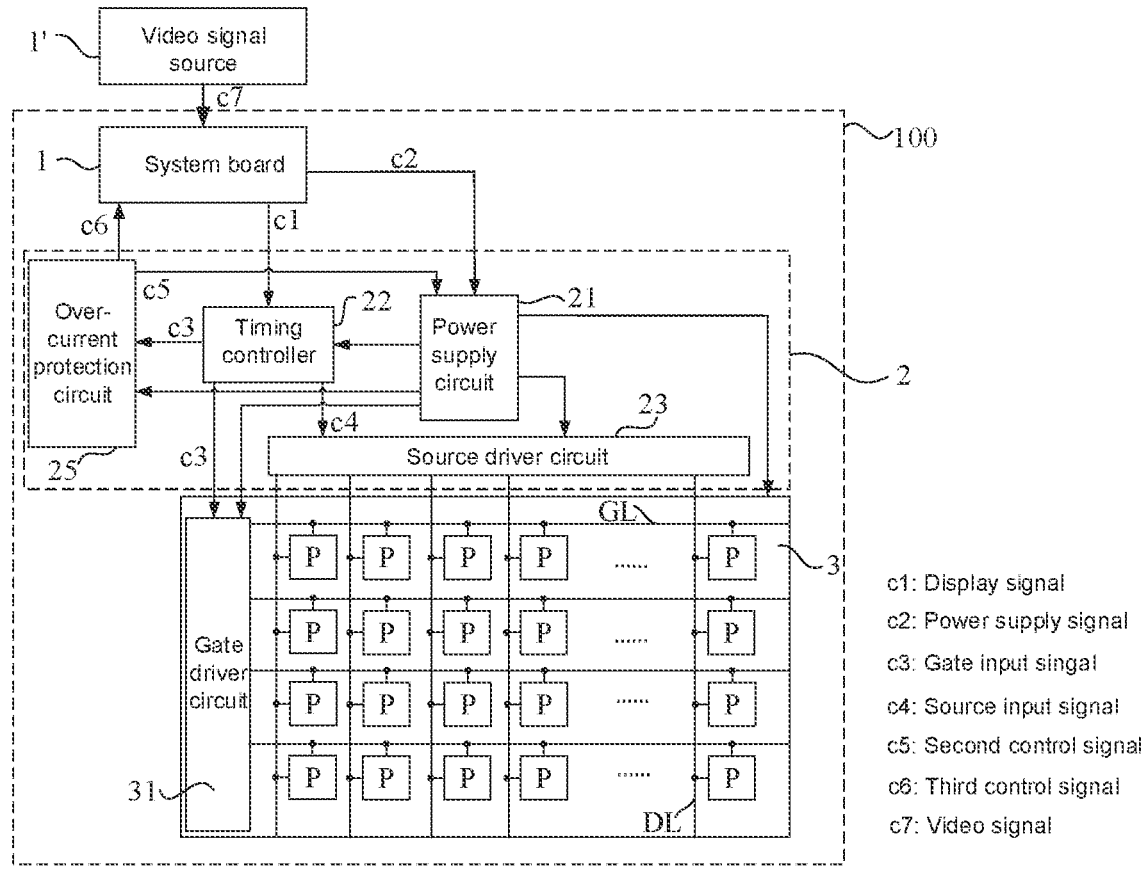
FIG. 2 is a diagram showing a structure of a display apparatus, in accordance with some embodiments.

Some embodiments of the present disclosure provide a display apparatus 100. As shown in FIG. 2, the display apparatus 100 includes a system board 1, a driver circuit 2 and a display panel 3.

The system board 1 is coupled to the driver circuit 2, and is configured to output a power supply signal c2 and a display signal c1 to the driver circuit 2, so as to control the display panel 3 to achieve display through the driver circuit 2. In some embodiments, the system board 1 is coupled to a video signal source (i.e., a signal source) 1', and the system board 1 receives a video signal c7 output by the video signal source 1', and generates the power supply signal c2 and the display signal c1 according to the received video signal c7.

In some examples, as shown in FIG. 2, the display panel 3 includes a plurality of gate lines GL, a plurality of data lines DL and a plurality of sub-pixels P. The plurality of sub-pixels P are disposed in a display area of the display panel 3. For example, the plurality of sub-pixels P are arranged in an array, and each sub-pixel P is provided with a pixel driver circuit. Sub-pixels P arranged in a line along a row direction are coupled to a same gate line GL, and sub-pixels P arranged in a line along a column direction are coupled to a same data line DL.

In some embodiments, as shown in FIG. 2, the driver circuit 2 includes a power supply circuit 21, a timing controller 22 and a source driver circuit 23.

The power supply circuit 21 is coupled to the system board 1 of the display apparatus 100 and the timing controller 22. The power supply circuit 21 is configured to receive the power supply signal c2 output by the system board 1, and supply power to the timing controller 22 according to the power supply signal c2.

For example, the power supply circuit 21 generates a power supply voltage required for operation of the timing controller 22 according to the received power supply signal c2, and then transmits the power supply voltage to the timing controller 22.

The timing controller 22 is further coupled to a gate driver circuit 31 and the source driver circuit 23. The timing controller 22 is configured to receive the display signal c1 output by the system board 1, and generate a plurality of date input signals c3 for input to the gate driver circuit 31 of the display apparatus 100. The timing controller 22 is further configured to generate a plurality of source input signals c4 for input to the source driver circuit 23 according to the display signal c1.

The gate driver circuit 31 is coupled to the power supply circuit 21 and the timing controller 22, and is configured to receive the plurality of gate input signals c3, and generate gate scanning signals according to the plurality of gate input signals c3.

The source driver circuit 23 is coupled to the power supply circuit 21 and the timing controller 22, and is configured to receive the plurality of source input signals c4, and generate data signals according to the plurality of source input signals c4.

For example, the display signal c1 from the system board 1 received by the timing controller 22 is a low voltage differential signal (LVDS), which includes a data enable (DE) signal, a horizontal synchronization (Hsync) signal, and a vertical synchronization (Vsync) signal. According to these signals, the timing controller 22 generates the plurality of gate input signals c3 required by the gate driver circuit 31 and the plurality of source input signals c4 required by the source driver circuit 23.

The plurality of gate input signals c3 refer to control signals output by the timing controller 22 for controlling operation of the gate driver circuit 31, which are generally referred to as gate driver on array (GOA) signals. For example, the plurality of gate input signals c3 include, but are not limited to, a start vertical (STV) signal, and a dock pulse vertical (CPV) signal (i.e., a dock (CLK) signal), and further include a voltage drain drain (VDD) signal and a voltage source source (VSS) signal. In some examples, the above signals each include more than one signal. For example, the STV signal includes signals (STV1, STV2, . . . , and STVn), the CLK signal includes signals (CLK1, CLK2, . . . , and CLKn), and the VDD signal also includes signals (VDD1 and VDD2). Depending on a specific structure of the gate driver circuit 31, the number of gate input signals c3 required by the gate driver circuit 31 is different.

The plurality of source input signals c4 refer to control signals output by the timing controller 22 for controlling operation of the source driver circuit 23. For example, the plurality of source input signals c4 include, but are not limited to, a start horizontal (STH) signal, and a clock pulse horizontal (CPH) signal (i.e., a CLK signal), and further include a VDD signal.

In some examples, the gate driver circuit 31 may be a gate driver integrated circuit (IC) to be bonded to the display panel 3. Similarly, the source driver circuit 23 may be a source driver IC to be bonded to the display panel 3. Based on this arrangement, the driver circuit 2 further includes the gate driver circuit 31 in addition to the power supply circuit 21, the timing controller 22 and the source driver circuit 23.

In some other examples, the gate driver circuit 31 may be a GOA circuit. That is, the gate driver circuit 31 is directly integrated in an array substrate of the display panel 3. Based on this arrangement, the display panel 3 further includes the gate driver circuit 31 in addition to the gate lines, the data lines and the plurality of sub-pixels; and the driver circuit 2 does not include the gate driver circuit 31.

For example, the gate driver circuit 31 has a plurality of output terminals, and an output terminal is coupled to a gate line GL in the display panel 3, The gate driver circuit 31 generates the gate scanning signals according to the gate input signals c3, and outputs the gate scanning signals to the plurality of gate lines GL, so that pixel driver circuits in the display panel 3 are turned on under control of the gate scanning signals transmitted by the gate lines GL, and receive the data signals transmitted by the data lines DL, thereby achieving the display.

As shown in FIG. 2, the power supply circuit 21 is further coupled to the gate driver circuit 31, the source driver circuit 23 and the display panel 3. The power supply circuit 21 is further configured to receive the power supply signal c2 output by the system board 1, and supply power to the gate driver circuit 31, the source driver circuit 23 and the display panel 3 according to the power supply signal c2.

For example, the power supply circuit 21 generates power supply voltages required for operations of the gate driver circuit 31, the source driver circuit 23 and the display panel 3 according to the received power supply signal c2, transmits the power supply voltages to the gate driver circuit 31, the source driver circuit 23 and the display panel 3 correspondingly, and thus supplies power to the gate driver circuit 31, the source driver circuit 23 and the display panel 3.

In some cases, the display signal c1 output by the system board 1 to the timing controller 22 may be abnormal, and the gate input signals c3 are generated according to the display signal c1 As a result, voltages (or currents) of one or more of the gate input signals c3 are greater than voltages (or currents) thereof in a normal state. That is, abnormality of the gate input signal(s) c3 such as overcurrent may occur.

For example, the timing controller 22 generates the plurality of gate input signals c3 required by the gate driver circuit 31 and the plurality of source input signals c4 required by the source driver circuit 23 according to the display signal c1 For example, the timing controller 22 generates the STV signal and the CLK signal in the plurality of gate input signals c3 according to the DE signal. In a case where a phase width of the DE signal in the display signal c1 transmitted by the system board 1 to the timing controller 22 is abnormal, phase disorder of the STV signal and CLK signal that are generated according to the DE signal may occur.

As shown in FIG. 1A, considering the STV signal and the CLK signal in the plurality of gate input signals c3 as an example, in a normal situation, the phase width of the DE signal remains normal, and logic of the timing controller 22 generating the STV signal and the CLK signal according to the DE signal is that, with reference to a second rising edge of the DE signal, a first rising edge of the STV signal is generated at a moment of the second rising edge of the DE signal, and then the STV signal is kept at an effective level for a period of time; with reference to a first rising edge of the DE signal, a rising edge of the CLK signal is generated at a moment when 1843 pixel clocks are fixedly counted from the first rising edge of the DE signal, and then the CLK signal is kept at an effective level for a period of time. In this way, as shown in FIG. 1A, a time at which the rising edge of the STV signal appears is earlier than a time at which the rising edge of the CLK signal appears.

Figure 1B:
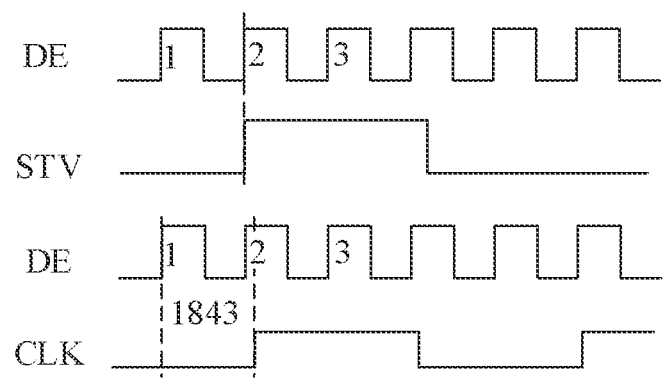
FIG. 1B is a diagram showing timings of a CLK signal and an STV signal that are generated according to a DE signal with abnormal phase.

However, in the case where the phase width of the DE signal is abnormal, as shown in FIG. 1B, a low-level width of the DE signal is excessively large, and the logic of the timing controller 22 generating the STV signal and the CLK signal according to the DE signal remains unchanged. As a result, the time at which the rising edge of the STV signal appears is close to the time at which the rising edge of the CLK signal appears, and in turn, the phase disorder occurs, that is, abnormality of gate input signals c3 occurs.

Therefore, a multigate phenomenon of the gate driver circuit 31 tray occur under control of the abnormal gate input signals. The multigate phenomenon may cause abnormal output of the gate driver circuit 31 and an excessive large current generated by the gate driver circuit 31. The excessive large current is fed back to a gate input signal c3 through a loop formed by the driver circuit 2 and the display panel 3 connected to each other, resulting in overcurrent abnormality of the gate input signal c3.

In a case where the output of the gate driver circuit 31 is abnormal and the multigate phenomenon of the gate driver circuit 31 occurs, abnormal scanning of the display panel 3 may occur, resulting in abnormal displayed images on the display panel 3. Moreover, in a case where the display panel 3 displays images for a long time when driven by the abnormal scanning, irreversible damage to the display panel 3 may be caused. For example, damage such as polarization of liquid crystal or drift of characteristics of thin film transistors (TFTs) may occur. As a result, a service life of the display panel 3 is reduced.

Based on this, as shown in FIG. 2, the driver circuit 2 provided in some embodiments of the present disclosure further includes an overcurrent protection circuit 25. The overcurrent protection circuit 25 is coupled to the power supply circuit 21 and the timing controller 22. The overcurrent protection circuit 25 is configured to acquire the plurality of gate input signals c3 output by the timing controller 22, continuously detect the plurality of gate input signals c3, and output a second control signal c5 to the power supply circuit 21 if overcurrent of a gate input signal c3 is detected.

The second control signal c5 is used for cutting off of inputting of a signal from the system board 1 of the display apparatus 100 to the driver circuit 2 of the display apparatus 100.

The power supply circuit 21 is further coupled to the overcurrent protection circuit 25. The power supply circuit 21 is further configured to receive the second control signal c5 output by the overcurrent protection circuit 25, and stop receiving the power supply signal c2 output by the system board 1 under control of the second control signal c5.

In the driver circuit 2, the power supply circuit 21 is configured to supply power to components included in the driver circuit 2 such as the timing controller 22, the overcurrent protection circuit 25 and the source driver circuit 23, and the display panel 3 and the gate driver circuit 31. Once the power is cut off, none of the components included in the driver circuit 2 and the display panel 3 is able to operate and achieve functions thereof. After receiving the second control signal c5, the power supply circuit 21 stops receiving the power supply signal c2 output by the system board 1 under the control of the second control signal c5, so that the power supply circuit 21 is not able to generate the power supply voltages required for the operations of the components according to the power supply signal c2, and is not able to supply power to the timing controller 22. As a result, the components included in the driver circuit 2, such as the timing controller 22, the overcurrent protection circuit 25 and the source driver circuit 23, all stop operating. For example, the timing controller 22 stops outputting the gate input signals c3 to the gate driver circuit 31, and stops outputting the source input signals c4 to the source driver circuit 23.

Based on the above, the display apparatus 100 provided in some embodiments of the present disclosure includes the system board 1, the driver circuit 2 and the display panel 3, and the driver circuit 2 is provided with the overcurrent protection circuit 25. After the display apparatus 100 starts to operate, the overcurrent protection circuit 25 starts a detection process. During the operation of the display apparatus 100, the overcurrent protection circuit 25 acquires the plurality of gate input signals c3 output by the timing controller 22, continuously detects the plurality of gate input signals c3, and outputs the second control signal c5 to the power supply circuit 21 if the overcurrent of the gate input signal c3 is detected, so that the power supply circuit 21 receives the second control signal c5 output by the overcurrent protection circuit 25, and stops receiving the power supply signal c2 output by the system board 1 under the control of the second control signal c5.

As a result, the power supply circuit 21 stops supplying power to the timing controller 22, the gate driver circuit 31 the source driver circuit 23 and the display panel 3, and in turn, the driver circuit 2 and the display panel 3 stop operating. The timing controller 22 stops generating the gate input signals c3, and stops outputting the gate input signals c3 to the gate driver circuit 31 so that an abnormal gate input signal c3 may be cut off in time, and is not input to the gate driver circuit 31. Therefore, it is possible to prevent the abnormal gate input signal c3 from adversely affecting the gate driver circuit 31, and avoid the multigate phenomenon of the gate driver circuit 31 caused by the abnormal output of the gate driver circuit 31, which causes the abnormal scanning of the display panel 3 and then causes the abnormal displayed images on the display panel 3. In turn, it is possible to avoid the irreversible damage to the display panel 3 caused by the display of the display panel 3 for a long time under the abnormal scanning driving. For example, the damage such as the polarization of the liquid crystal or the drift of the characteristics of the TFTs may occur. Thus, the display panel 3 may be protected, and the service life of the display panel 3 may be prolonged.

That is to say, for the display apparatus 100 provided in the embodiments of the present disclosure, by providing the overcurrent protection circuit 25 in the driver circuit 2 to continuously detect the gate input signals c3, it is possible to ensure that overcurrent abnormality of the gate input signal c3 caused by the abnormality of the display signal c1 is detected in time. Furthermore, the overcurrent protection circuit 25 outputs the second control signal c5 at a moment when the abnormality is detected to cut off the inputting of the power supply signal c2 and stop the power supply to the display apparatus 2, so that the display panel 3 and the driver circuit 2 are protected, and the display panel 3 and the driver circuit 2 are prevented from being adversely affected due to continuous operation of the display apparatus 100.

In some embodiments, the system board 1 is further coupled to the overcurrent protection circuit 25 in the driver circuit 2, and the overcurrent protection circuit 25 is further configured to continuously detect the plurality of gate input signals c3, and output a third control signal c6 to the system board 1 if the overcurrent of the gate input signal c3 is detected. The third control signal c6 is used for cutting off of inputting of a signal from the signal source to the system board 1.

The system board 1 is further configured to receive the third control signal c6, and stop receiving the video signal c7 output by the video signal source 1' under control of the third control signal c6.

The abnormality of the display signal c1 output by the system board 1 to the timing controller 22 causes abnormality of the gate input signal c3. The abnormality of the display signal c1 output by the system board 1 may be caused by the video signal c7 from the video signal source 1' received by the system board 1. When detecting an overcurrent abnormality of the gate input signal c3, the overcurrent protection circuit 25 outputs the second control signal c5 to the power supply circuit 21, so that the power supply circuit 21 stops receiving the power supply signal c2 output by the system board 1, and the power is cut off. Based on this, the overcurrent protection circuit 25 further outputs the third control signal c6 to the system board 1, so that the system board 1 stops receiving the video signal c7 output by the video signal source 1" under the control of the third control signal c6. In this way, the system board 1 may cut off the inputting of the original signal source at source, and it is possible to improve reliability of an overcurrent protection system of the display apparatus 100, reduce invalid driving of the system board 1, and prevent a possible abnormal source signal from adversely affecting to the system board 1.

Based on the display apparatus 100 and the driver circuit 2, the overcurrent protection circuit 25 will be described in detail below.

Figure 3:
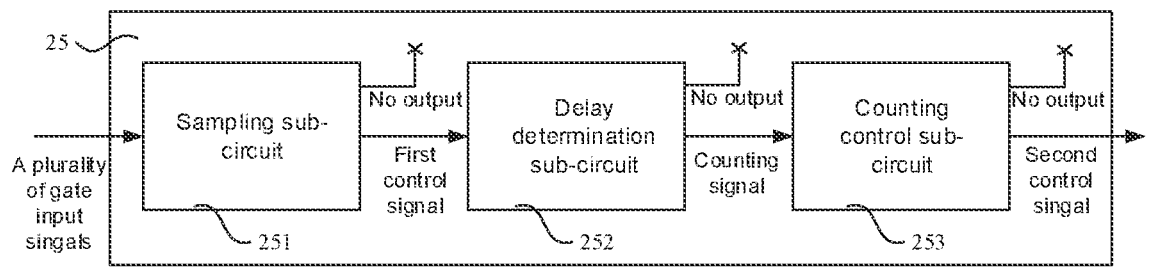
FIG. 3 is a diagram showing a structure of an overcurrent protection circuit, in accordance with some embodiments.

As shown in FIG. 3, some embodiments of the present disclosure provide the overcurrent protection circuit 25. The overcurrent protection circuit 25 is configured to continuously detect the plurality of gate input signals c3 input to the gate driver circuit 31.

Figure 4A:
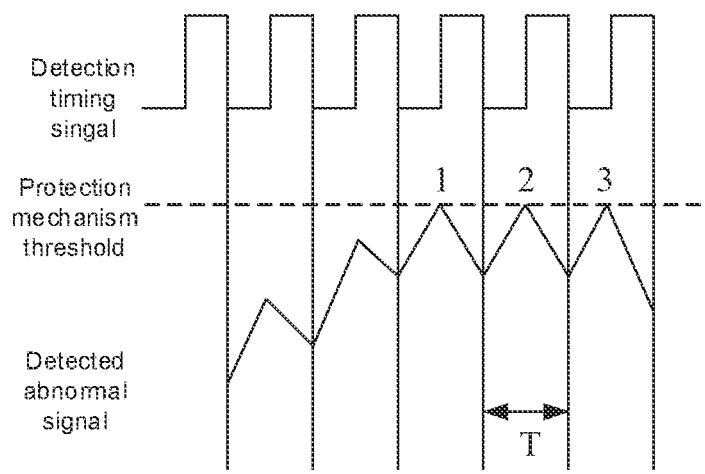
FIG. 4A is a diagram showing a detection timing of an overcurrent protection circuit, in accordance with some embodiments.
Figure 4B:
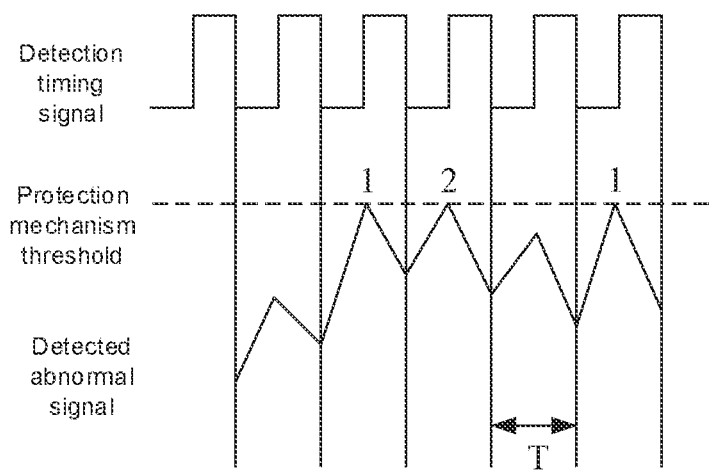
FIG. 4B is a diagram showing a detection timing of an overcurrent protection circuit, in accordance with some other embodiments.

For example, the overcurrent protection circuit 25 detects the plurality of gate input signals c3 once in each clock cycle under control of a detection timing signal shown in FIGS. 4A and 4B, so as to achieve continuous detection. For example, in a next clock cycle (e.g., a square-wave cycle) T, when a falling edge or a rising edge of the detection timing signal, the detection is performed again. The embodiments of the present disclosure are described by taking an example in which the detection is started at a moment of arrival of the falling edge of the detection timing signal.

As shown in FIG. 3, the overcurrent protection circuit 25 includes a sampling sub-circuit 251, a delay determination sub-circuit 252, and a counting control sub-circuit 253.

The sampling sub-circuit 251 is configured to: acquire the plurality of gate input signals c3, and select a gate input signal c3 with a voltage value greater than a first preset voltage value in the plurality of gate input signals c3 as a sample gate input signal; and generate a first control signal according to the sample gate input signal, and output the first control signal. The first preset voltage value is a critical voltage value at which a transition between a normal state and an overcurrent state of a voltage of a gate input signal c3 occurs.

During detection in a clock cycle T, in a case where a voltage value of each of the plurality of gate input signals c3 is less than or equal to the first preset voltage value, the sampling sub-circuit 251 outputs no signal; and detection in a next clock cycle is started at a moment of arrival of a next falling edge of the detection timing signal.

The normal state of the voltage of the gate input signal c3 means that, in a case where the display signal c1 output by the system board 1 to the timing controller 22 is normal, the plurality of gate input signals c3 generated by the timing controller 22 according to the display signal c1 are normal signals, and no phase disorder occurs, so that no overcurrent abnormality of the gate input signal c3 occurs, and the voltage of the gate input signal c3 is in the normal state.

The overcurrent state of the voltage of the gate input signal c3 means that, as described above, in a case where the display signal c1 output by the system board 1 to the timing controller 22 is abnormal, phase disorder of a plurality of gate input signals c3 generated by the timing controller 22 according to the display signal c1 may occur, so that the multigate phenomenon of the gate driver circuit 31 may occur under control of abnormal gate input signals c3, which causes the abnormal output of the gate driver circuit 31 and the excessively large current generated by the gate driver circuit 31. As a result, voltages (or currents) of one or more of the gate input signals c3 are excessively large, and the voltage of the gate input signal c3 is in the overcurrent state.

By providing the first preset voltage value, once it is detected that a voltage value of one of the plurality of gate input signals c3 is greater than the first preset voltage value, it is considered that overcurrent abnormality of the gate input signal c3 occurs, and the selected gate input signal c3 is used as the sample gate input signal.

As a possible design, a gate input signal c3 with a current value greater than a first preset current value selected from the plurality of gate input signals c3 may also be used as a sample gate input signal. The first preset current value is a critical current value at which a transition between a current normal state and an overcurrent state of a gate input signal c3 occurs. For specific explanation of the first preset current value, reference may be made to the above explanation of the first preset voltage value. Since there is a correspondence between a current and a voltage of a signal, and the current and the voltage of the signal may be converted to each other, regardless of whether by detecting the current or the voltage of the gate input signal c3, it may be determined whether overcurrent abnormality of the gate input signal c3 occurs. The embodiments of the present disclosure are described by taking an example in which the overcurrent abnormality of the gate input signal c3 is detected by detecting the voltage of the gate input signal c3.

In some examples, the first preset voltage value is a threshold that may be set according to actual situations. The abnormal gate input signal c3 may cause the abnormal output of the gate driver circuit 31 and then cause the multigate phenomenon of the gate driver circuit 31. As a result, the abnormal scanning of the display panel 3 may occur, and in turn, the images displayed on the display panel 3 are abnormal, and an internal structure of the display panel 3 may be damaged due to long-time abnormal display of the display panel 3. The first preset voltage value may be set according to a size and a resolution of the display panel 3.

The delay determination sub-circuit 252 is coupled to the sampling sub-circuit 251. The delay determination sub-circuit 252 is configured to: receive the first control signal output by the sampling sub-circuit 251, delay the first control signal for a first preset time, determine whether a voltage value of a first control signal after delay is less than a voltage value of the first control signal before the delay, and if the voltage value of the first control signal after the delay is not less than the voltage value of the first control signal before the delay, output a counting signal.

The delay determination sub-circuit 252 determines whether the voltage value of the first control signal after the delay is less than the voltage value of the first control signal before the delay. If the voltage value of the first control signal after the delay is less than the voltage value of the first control signal before the delay, the delay determination sub-circuit 252 outputs no signal. A detection in a next clock cycle is started at a moment of arrival of the next clock.

When the sampling sub-circuit 251 detects the plurality of gate input signals c3, due to influence of some factors, a voltage (or current) of a gate input signal c3 may be increased instantaneously at a moment when the gate input signal c3 is input to the sampling sub-circuit 251. This current is referred to as an inrush current, i.e., a sudden peak current. For example, at a moment when the display apparatus 100 starts, a current input to the power supply circuit 21 in the driver circuit 2 reaches a peak value, which causes that other signals also reach peak values. This peak current is much greater than an input current in a steady state.

Therefore, the following situation may occur. In a case where a gate input signal c3 with a voltage value less than the first preset voltage value has a peak current (a current and a voltage of a signal being related to each other), the voltage of the gate input signal c3 is increased to a voltage value greater than the first preset voltage value, so that the gate input signal c3 is used as the sample gate input signal. In this way, the selected sample gate input signal is not a sample gate input signal with a voltage value truly greater than the first preset voltage value, but a sample gate input signal c3 selected in a case where the peak current occurs. Therefore, a first control signal generated according to the wrong sample gate input signal may be inaccurate, resulting in an inaccurate detection result. Hereinafter, the sample gate input signal obtained in the case where the peak current occurs is referred to as the wrong sample gate input signal, and a sample gate input signal obtained in the steady state is referred to as a correct sample gate input signal.

Generally, the peak current only lasts for a very short time, after which the peak current is decreased from a high current value (or voltage value) to an original value. The delay determination sub-circuit 252 delays the first control signal and determines whether the voltage value of the first control signal after the delay is less than the voltage value of the first control signal before the delay. If the voltage value of the first control signal after the delay is less than the voltage value of the first control signal before the delay, it means that the received first control signal is generated according to the wrong sample gate input signal, and the sample gate input signal is not truly in an overcurrent state. In this case, the delay determination sub-circuit 252 outputs no signal. If the voltage value of the first control signal after the delay is not less than the voltage value of the first control signal before the delay, it means that the first control signal is generated according to the correct sample gate input signal, and a voltage value of the sample gate input signal in the steady state is greater than the first preset voltage value. In this case, the sample gate input signal is truly in the overcurrent state.

It will be noted that, since the first control signal is generated according to the sample gate input signal, the first control signal may reflect a situation of the sample gate input signal, and by delaying the first control signal and determining whether the voltage value of the first control signal after the delay is less than the voltage value of the first control signal before the delay, it will be known whether the selected sample gate input signal is accurate.

According to a duration of the peak current, for example, the first preset time may be in a range of 3 µs to 5 µs inclusive.

By providing the delay determination sub-circuit 252 to delay and determine the first control signal output by the sampling sub-circuit 251, accuracy of the obtained first control signal may be ensured, and the sample gate input signal obtained in the case where the peak current occurs is discarded, so that the accuracy of the sample gate input signal is ensured, and accuracy of the detection is improved.

The counting control sub-circuit 253 is coupled to the delay determination sub-circuit 252. The counting control sub-circuit 253 is configured to receive the counting signal output by the delay determination sub-circuit 252, and perform daunting according to the counting signal. In a case where a counted number reaches a preset number, the counting control sub-circuit 253 outputs the second control signal c5 for the cutting off of the inputting of the signal from the system board 1 of the display apparatus 100 to the driver circuit 2 of the display apparatus 100.

After the delay determination sub-circuit 252 outputs the counting signal, the counting control sub-circuit 253 starts to perform the counting. If the counted number reaches the preset number (e.g., three), it means that, in each of three consecutive dock cycles T, it is detected that a voltage value of at least one gate input signal c3 is greater than the first preset voltage value. This means that overcurrent abnormality of the gate input signal c3 occurs and lasts for at least three clock cycles T. In this case, the counting control sub-circuit 253 outputs the second control signal c5 for cutting off of inputting of the signal from the system board 1 of the display apparatus 100 to the driver circuit 2 of the display apparatus 100, so that the driver circuit 2 and the display panel 3 stop operating, and the gate driver circuit 31 and the display panel 3 are protected. For example, the second control signal c5 is configured to cause the power supply circuit 21 to stop receiving the power supply signal c2 output by the system board 1, so as to stop supplying power to the driver circuit 2 and the display panel 3.

In some embodiments, the counting control sub-circuit 253 is further configured to, if the counted number does not reach the preset number, determine whether the counted number is increased within a second preset time thereafter (i.e., after a clock cycle in which it is determined that the counted number does not reach the preset number), and if the counted number is not increased in the second preset time thereafter, reset the counted number to zero.

For example, in a case where the preset number is 3 if the current counted number is 2, that is, the overcurrent abnormality of the gate input signal c3 is detected in two consecutive clock cycles T. If a counted number is not increased in a next clock cycle T, that is, the overcurrent abnormality of the gate input signal c3 does not occur in a third clock cycle T, the counted number is reset to zero. For example, a duration of a respective clock cycle T is 50 µs; and if the counted number does not reach the preset number, it is determined whether the counted number is increased within 50 µs thereafter (i.e., after the two consecutive dock cycles), and if the counted number is not increased within 50 µs thereafter, the counted number is reset to zero.

If it is detected that overcurrent abnormality of a gate input signal c3 occurs and lasts for only one dock cycle T, a reason thereof may be that the gate input signal c3 is disturbed and a voltage or a current of the gate input signal c3 rises temporarily, rather than that the abnormality of the display signal c1 (e.g., the abnormality of the phase width of the display signal c1) causes the overcurrent abnormality. If the second control signal c5 is output directly at a moment when the overcurrent abnormality of the gate input signal c3 is detected, a detection result is inaccurate, and normal operation of the display apparatus 100 is affected due to the unnecessary output of the second control signal c5. By providing the counting control sub-circuit 253, the second control signal c5 is output in a case where the counted number reaches the preset number, so that the inputting of the signal from the system board 1 of the display apparatus 100 to the driver circuit 2 of the display apparatus 100 is cut off. That is, the second control signal c5 is output in a case where overcurrent abnormality of a gate input signal c3 lasts for at least a certain time. In this way, it is possible to ensure that the overcurrent abnormality of the gate input signal c3 currently detected is caused by the abnormality of the display signal c1, to improve accuracy of detecting the overcurrent abnormality of the gate input signal c3, and to avoid the unnecessary output of the second control signal c5.

In some embodiments of the present disclosure, the overcurrent protection circuit 25 includes the sampling sub-circuit 251, the delay determination sub-circuit 252 and the counting control sub-circuit 253 coupled in sequence. By continuously detecting the plurality of gate input signals c3 input to the gate driver circuit 31 by the sampling sub-circuit 251, the delay determination sub-circuit 252 and the counting control sub-circuit 253, real-time detection of the gate input signals c3 may be achieved. In a case where the overcurrent abnormality of the gate input signal c3 occurs, the overcurrent abnormality may be accurately detected, and in turn, the second control signal c5 is output for cutting off of inputting of the power supply signal c2, and the power supply to the display apparatus 100 is stopped, so that the display panel 3 and the entire driver circuit 2 are protected. In addition, by discarding the case where a peak current of a gate input signal c3 occurs through the delay determination sub-circuit 252, and by providing the counting control sub-circuit 253, the second control signal c5 is output in the case where the counted number reaches the preset number, it is possible to avoid a wrong response due to temporary disturbance of a gate input signal, and improve the accuracy of the detection result.

In some embodiments, as shown in FIG. 5, the sampling sub-circuit 251 includes a signal selection unit 2511. The signal selection unit 2511 is configured to receive the plurality of gate input signals c3, and select the gate input signal c3 with the voltage value greater than the first preset voltage value in the plurality of gate input signals c3 as the sample gate input signal.

In the above embodiments, the signal selection unit 2511 selects the gate input signal c3 with the voltage value greater than the first preset voltage value in the plurality of gate input signals c3 as the sample gate input signal, and the sample gate input signal is output as the first control signal. The signal selection unit 2511 is coupled to the delay determination sub-circuit 252. The delay determination sub-circuit 252 delays the sample gate input signal and determines whether the voltage value of the sample gate input signal after the delay is less than the voltage value of the sample gate input signal before the delay. Thus, it may be determined whether duration for which the voltage value of the sample gate input signal is greater than the first preset voltage value is greater than the first preset time, and it may be known whether the obtained sample gate input signal is accurate.

Figure 5A:
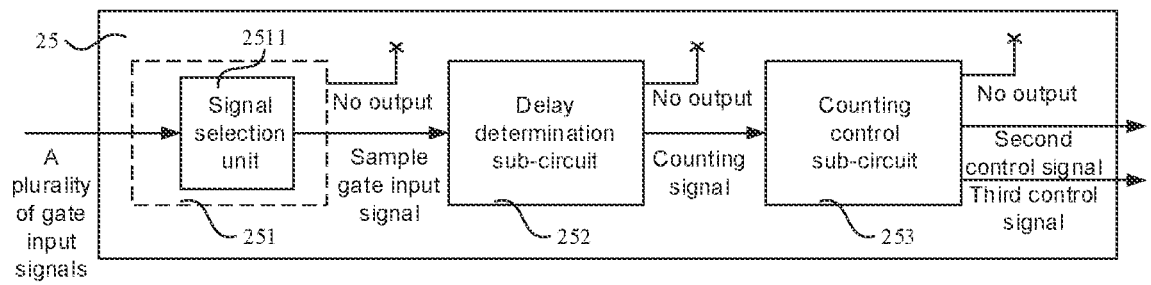
FIG. 5A is a diagram showing a structure of another overcurrent protection circuit, in accordance with some embodiments.
Figure 5B:
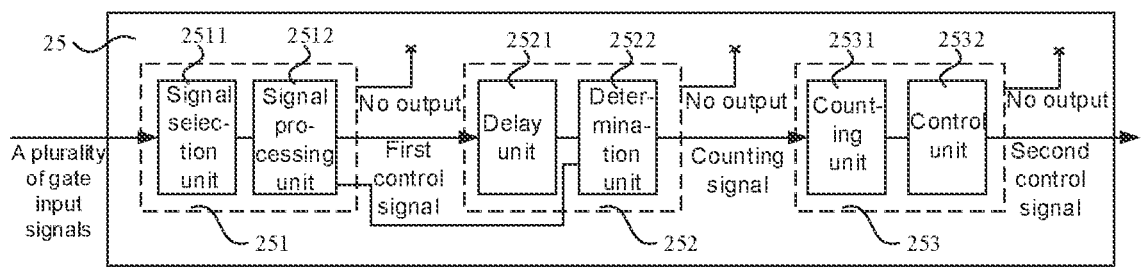
FIG. 5B is a diagram showing a structure of yet another overcurrent protection circuit, in accordance with some embodiments.

In some embodiments, as shown in FIG. 5B, the sampling sub-circuit 251 further includes a signal processing unit 2512 couple to the signal selection unit 2511. The signal processing unit 2512 is configured to receive the sample gate input signal output by the signal selection unit 2511, perform de-interference processing and amplification processing on the sample gate input signal, generate the first control signal according to the de-interfered and amplified sample gate input signal and a second preset voltage value, and output the first control signal. The second preset voltage value is obtained according to an amplification factor for the amplification processing.

The sample gate input signal output by the signal selection unit 2511 is a gate input signal c3 in the plurality of gate input signals c3. This signal is a signal that is directly output without any processing, and may be unstable and weak in intensity. In the above embodiments, the sampling sub-circuit 251 includes the signal selection unit 2511 and the signal processing unit 2512. After the signal selection unit 2511 selects the sample gate input signal, the signal processing unit 2512 receives the sample gate input signal, and processes the sample gate input signal, so as to remove interference information in the sample gate input signal, and amplify the sample the sample gate input signal to make the sample gate input signal more stable, and generates the first control signal according to the processed sample gate input signal and the second preset voltage value. Compared with the sample gate input signal without any processing, the first control signal is a constant voltage signal, and is more stable.

Thus, in subsequent operations, stability and accuracy of the entire detection process may be improved.

Figure 6:
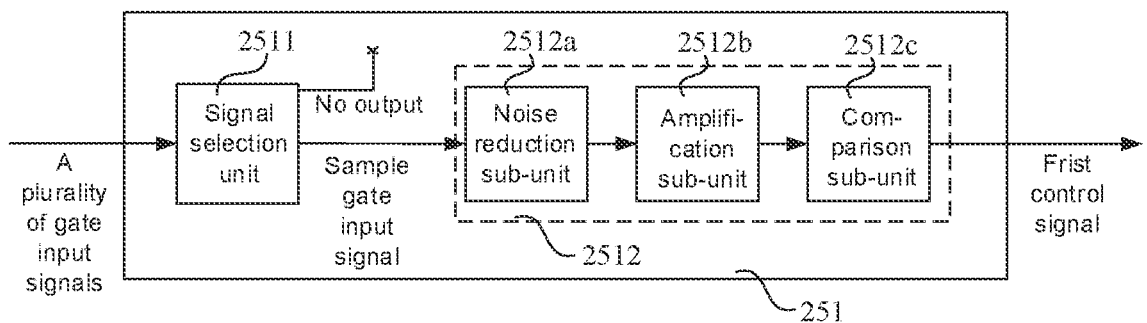
FIG. 6 is a diagram showing a structure of a sampling sub-circuit in an overcurrent protection circuit, in accordance with some embodiments.

In some examples, as shown in FIG. 6, the signal processing unit 2512 includes a noise reduction sub-unit 2512a, an amplification sub-unit 2512b and a comparison sub-unit 2512c.

The noise reduction sub-unit 2512a is coupled to the signal selection unit 2511, and the noise reduction sub-unit 2512a is configured to receive the sample gate input signal output by the signal selection unit 2511, perform the de-interference processing on the sample gate input signal, and output the de-interfered sample gate input signal. In this way, the interference information in the sample gate input signal may be removed, and noise may be filtered out, and in turn, the sample gate input signal may be more pure and more accurate.

Figure 7:
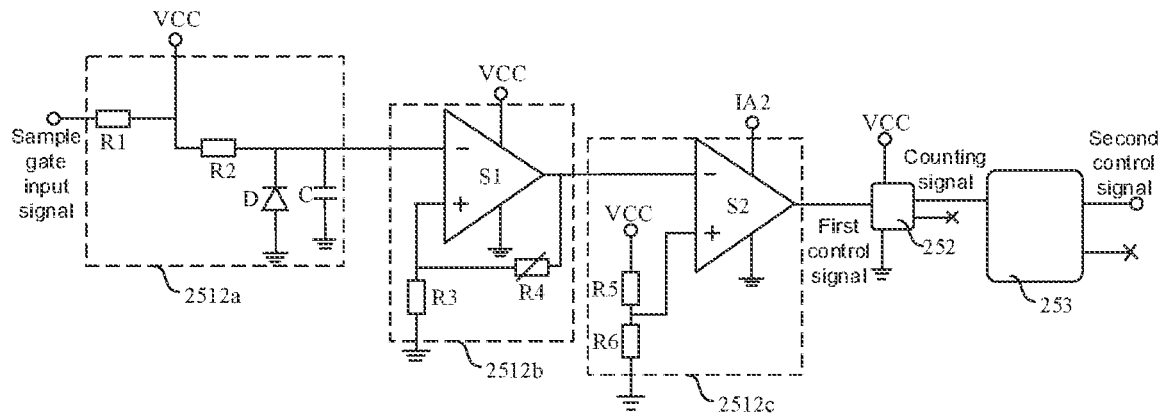
FIG. 7 is a diagram showing a structure of yet another overcurrent protection circuit, in accordance with some embodiments.

For example, as shown in FIG. 7, the noise reduction sub-unit 2512a includes a first resistor R1, a second resistor R2, a light-emitting diode D and a capacitor C. A first end of the first resistor R1 is coupled to a signal input terminal of the noise reduction sub-unit 2512a. A second end of the first resistor R1 is coupled to a first end of the second resistor R2, and is further coupled to a first voltage signal terminal VCC. A second end of the second resistor R2 is coupled to a signal output terminal of the noise reduction sub-unit 2512a, A cathode of the light-emitting diode D is coupled to the second end of the second resistor R2, and an anode of the light-emitting diode D is grounded. A first end of the capacitor C is coupled to the second end of the second resistor R2, and a second end of the capacitor C is grounded. A combination of the first resistor R1, the second resistor R2, the light-emitting diode D and the capacitor C has a filter-like function, and is able to perform the de-interference processing on the sample gate input signal.

As shown in FIG. 6, the amplification sub-unit 2512b is coupled to the noise reduction sub-unit 2512a, and the amplification sub-unit 2512b is configured to receive the de-interfered sample gate input signal output by the noise reduction sub-unit 2512a, perform the amplification processing on the de-interfered sample gate input signal, and output the de-interfered and amplified sample gate input signal.

Since the amplification sub-unit 2512b performs the amplification processing on the de-interfered sample gate input signal, it is possible to increase the signal intensity of the de-interfered sample gate input signal, convert the weak signal into a strong and stable signal, and facilitate acquisition and processing of the sample gate input signal by a subsequent sub-unit.

For example, as shown in FIG. 7, the amplification sub-circuit 2512b includes a first operational amplifier S1, a third resistor R3 and a fourth resistor R4. The first operational amplifier S1 has an inverting input terminal, a non-inverting input terminal and an output terminal. The inverting input terminal of the first operational amplifier S1 is a signal input terminal of the amplification sub-circuit 2512b, the output terminal of the first operational amplifier S1 is a signal output terminal of the amplification sub-circuit 2512b, and the non-inverting input terminal of the first operational amplifier S1 is coupled to an end of the third resistor R3. Another end of the third resistor R3 is grounded. The fourth resistor R4 is coupled between the non-inverting input terminal and the output terminal of the first operational amplifier S1. The fourth resistor R4 is a variable resistor, and an amplification factor of the amplification sub-circuit 2512b may be adjusted as required by adjusting a resistance of the fourth resistor R4.

As shown in FIG. 6, the comparison sub-unit 2512c is coupled to the amplification sub-unit 2512b, and the comparison sub-unit 2512c is configured to receive the de-interfered and amplified sample gate input signal output by the amplification sub-unit 2512b, generate the first control signal according to the de-interfered and amplified sample gate input signal and the second preset voltage value, and output the first control signal.

For example, the comparison sub-unit 2512c is configured to: compare a voltage value of the de-interfered and amplified sample gate input signal with the second preset voltage value: and if the voltage value of the de-interfered and amplified sample gate input signal is greater than the second preset voltage value, generate the first control signal. The sample gate input signal is a selected gate input signal c3 with a voltage value greater than the first preset voltage value, and the signal processing unit processes the sample gate input signal to make it more stable. In this case, the second preset voltage value needs to be determined according to the amplification factor of the amplification sub-unit 2512b, so as to ensure that the sample gate input signal is greater than the second preset voltage value, and in turn ensure that the comparison sub-unit 2512c outputs the first control signal.

Similarly, the comparison sub-unit 2512c is configured to: compare the voltage value of the de-interfered and amplified sample gate input signal with the second preset voltage value: and if the voltage value of the de-interfered and amplified sample gate input signal is less than the second preset voltage value, generate the first control signal. In this case, the second preset voltage value needs to be determined according to the amplification factor of the amplification sub-unit 2512b, so as to ensure that the sample gate input signal is less than the second preset voltage value, and in turn ensure that the comparison sub-unit 2512c outputs the first control signal.

For example, as shown in FIG. the comparison sub-unit 2512c includes a second operational amplifier S2, a fifth resistor R5 and a sixth resistor R6. The second operational amplifier S2 has an inverting input terminal, a non-inverting input terminal and an output terminal. The inverting input terminal of the second operational amplifier S2 is a signal input terminal of the comparison sub-unit 2512c, and the output terminal of the second operational amplifier S2 is a signal output terminal of the comparison sub-unit 2512c. The second operational amplifier S2 is coupled to a second preset voltage signal terminal IA2 and is grounded. A first end of the fifth resistor R5 is coupled to the first voltage signal terminal, and a second end of the fifth resistor R5 is coupled to the non-inverting input terminal of the second operational amplifier S2. A first end of the sixth resistor R6 is coupled to the second end of the fifth resistor R5, and a second end of the sixth resistor R6 is grounded. Due to a voltage division effect of the fifth resistor R5 and the sixth resistor R6, a voltage of a signal input into the non-inverting input terminal of the second operational amplifier S2 is a reference voltage, which is less than a voltage of a first voltage signal transmitted by the first voltage signal terminal. The inverting input terminal of the second operational amplifier S2 receives the de-interfered and amplified sample gate input signal output by the amplification sub-unit 2512b. For example, in a case where the de-interfered and amplified sample gate input signal is greater than the reference voltage and a voltage value thereof is greater than the second preset voltage value, the second operational amplifier S2 outputs the first control signal, The first control signal is a constant voltage signal such as a high voltage signal, which is output by the comparison sub-unit 2512c after the comparison. The constant first control signal is more stable, which further facilitates that the delay determination sub-circuit 252 performs operation on the constant first control signal subsequently, so as to output the counting signal to a counting control sub-circuit and make the counting control sub-circuit 253 perform the counting.

In some embodiments, the signal selection unit 2511 is configured to: receive the plurality of gate input signals c3; compare voltage values of the plurality of gate input signals c3 with the first preset voltage value separately; and if a voltage value of a gate input signal c3 is greater than the first preset voltage value, use the gate input signal c3 as the sample gate input signal.

In some other embodiments, the signal selection unit 2511 is configured to: receive the plurality of gate input signals c3, select a gate input signal c3 with a greatest voltage value in the plurality of gate input signals c3; compare the voltage value of the selected gate input signal c3 with the first preset voltage value; and if the voltage value of the selected gate input signal c3 is greater than the first preset voltage value, use the gate input signal c3 as the sample gate input signal.

In the signal selection unit 2511, the gate input signal c3 with the greatest voltage value (which is referred to as the largest gate input signal c3 below) in the plurality of gate input signals c3 is first selected, and then the voltage value of the largest gate input signal c3 is compared with the first preset voltage value. If the voltage value of the largest gate input signal c3 is less than the first preset voltage value, it means that no overcurrent abnormality of the plurality of gate input signals c3 occurs; and if the voltage value of the largest gate input signal c3 is greater than the first preset voltage value, it means that overcurrent abnormality of one or more gate input signals c3 occurs, and the largest gate input signal c3 is output as the sample gate input signal. In this way, selection steps may be reduced, selection time may be saved, and the accuracy of the obtained result is high.

In some embodiments, a specific structure of the signal selection unit 2511 is as follows. The number of the plurality of gate input signals c3 is x, the signal selection unit 2511 includes n stages of selector groups, and a selector group in an i-th stage includes $2^{(n-i)}$ selectors; here, x is a positive integer greater than or equal to 3, n is a positive integer greater than or equal to 2, and i takes a value in a positive integer set of [1, n] in sequence.

During driving of the gate driver circuit 31, the required plurality of gate input signals c3 include at least the CLK signal, the STV signal and the VDD signal. Thus, the number of the plurality of gate input signals c3 is at least three.

A selector has two input terminals and one output terminal. Two input terminals of a selector in a selector group in an (i+1)-th stage are coupled to output terminals of two selectors in the selector group in the i-th stage, respectively.

Figure 8A:
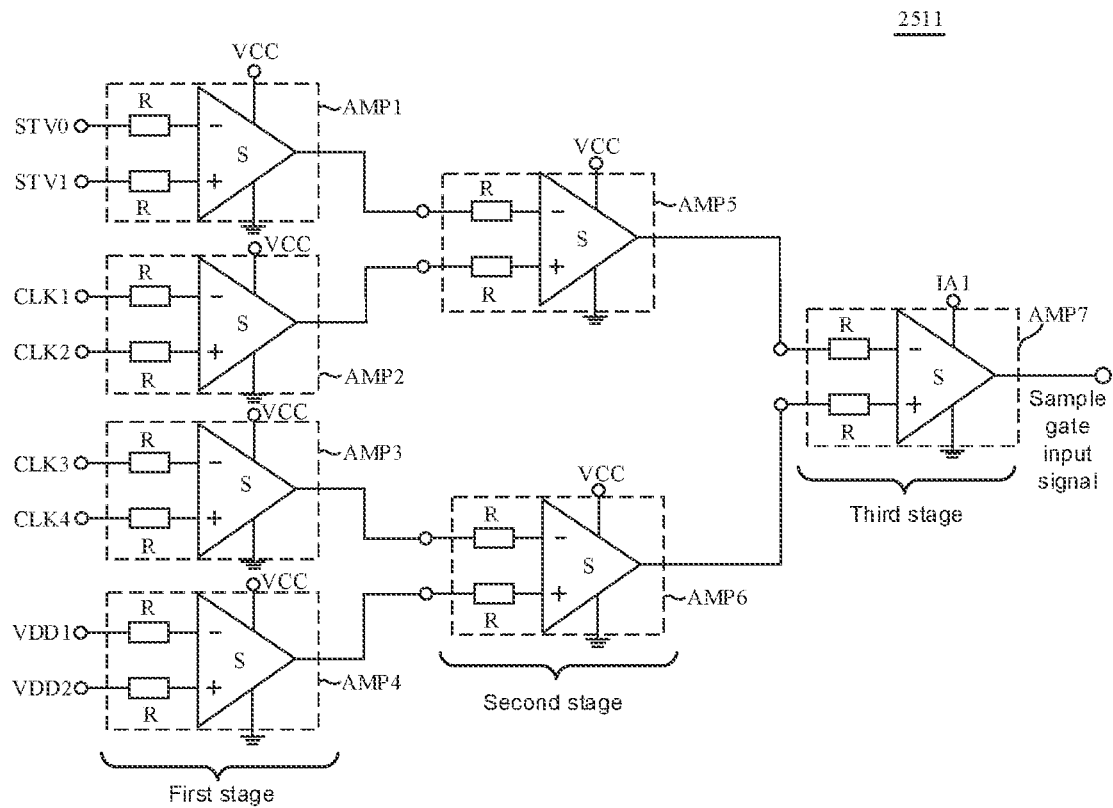
FIG. 8A is a diagram showing a structure of a signal selection unit, in accordance with some embodiments.

For example, as shown in FIG. 8A, the number of the plurality of gate input signals c3 is eight (e.g., the plurality of gate input signals c3 include signals (CLK1, CLK2 CLK3, CLK4, STV1, STV2. VDD1 and VDD2)). The signal selection unit 2511 includes three stages of selector groups, a selector group in a first stage includes four selectors (AMP1, AMP2, AMP3 and AMP4), a selector group in a second stage includes two selectors (AMP5 and AMP3), and a selector group in a third stage includes one selector (AMP7). Two input terminals of a selector in the selector group in the second stage are respectively coupled to output terminals of two selectors in a selector group in the first stage, and two input terminals of a selector in the selector group in the third stage are respectively coupled to output terminals of the two selectors in the selector group in the second stage.

The selector group in the first stage is configured to acquire the plurality of gate input signals c3, and each selector in the selector group in the first stage is configured to receive two of the plurality of gate input signals c3, and output a gate input signal c3 with a greater voltage value in the received two gate input signals c3.

For example, as shown in FIG. 8A, each selector in the selector group in the first stage is configured to receive two of the plurality of gate input signals c3. For example, the selector AMP1 receives two gate input signals (STV0 and STV1). In a case where the number of the plurality of gate input signals c3 is eight, and the selector group in the first stage includes four selectors, each of the four selectors receives two of the eight gate input signals c3, and outputs a gate input signal c3 with a greater voltage value in the received two gate input signals c3.

Each selector has two input terminals and is able to receive two gate input signals c3, and the selector group in the first stage includes $2^{(n-1)}$ selectors, and each selector in the selector group in the first stage is configured to receive two gate input signals c3. Therefore, a relationship between the number of stages of selector groups included in the signal selection unit and the number of gate input signals c3 is as follows. In a case where the signal selection unit 2511 includes n stages of selector groups, the selector group in the first stage is able to receive at most $2^n$ gate input signals c3. For example, in a case where the signal selection unit 2511 includes three stages of selector groups, the selector group in the first stage includes four selectors, and the selector group in the first stage is able to receive at most eight gate input signals c3. In a case where the signal selection unit 2511 includes four stages of selector groups, the selector group in the first stage includes eight selectors, and the selector group in the first stage is able to receive at most sixteen gate input signals c3.

In a case where the number of the plurality of gate input signals c3 is an even number, taking every two gate input signals as a group, the plurality of gate input signals c3 are input to the plurality of selectors in the selector group in the first stage for comparison.

In a case where the number of the plurality of gate input signal c3 is an odd number, for example, the number of the plurality of gate input signals c3 is seven, six of the seven gate input signals c3 are divided into three groups, each of the three groups includes two gate input signals c3, and the three groups are respectively input to three selectors in the selector group in the first stage; the remaining gate input signal c3 of the seven gate input signals c3 is input to one selector in the selector group in the first stage, and the remaining gate input signal c3 is directly input into the selector group in the second stage through the selector, so as to be compared with one of the six gate input signals c3 that enters the selector group in the second stage.

The selector group in the (i+1)-th stage is configured to receive gate input signals c3 output by the selector group in the i-th stage. Each selector in the selector group in the (i+1)-th stage is configured to receive two of the gate input signals c3 output by the selector group in the i-th stage, and output a gate input signal c3 with a greater voltage value in the received two gate input signals c3.

As shown in FIG. 8A, the selector group in second stage is configured to receive the gate input signals c3 output by the selector group in the first stage, and the two selectors in the selector group in second stage are each configured to receive two of the gate input signals c3 output by the selector group in the first stage, and output a gate input signal c3 with a greater voltage value in the received two gate input signals c3.

A selector in a selector group in an n-th stage is configured to receive two gate input signals c3 output by a selector group in an (n−1)-th stage, select a gate input signal c3 with a greater voltage value in the two gate input signals c3, compare the voltage value of the selected gate input signal c3 with the first preset voltage value, and if the voltage value of the selected gate input signal c3 is greater than the first preset voltage value, use the selected gate input signal c3 as the sample gate input signal.

The selector group in the n-th stage is a selector group in a last stage. As shown in FIG. 8A, the selector group in the third stage is coupled to a first preset voltage terminal IA1, and is configured to receive two gate input signals c3 output by the selector group in the second stage, and select a gate input signal c3 with a greater voltage value in the two gate input signals c3. In this way, the gate input signal c3 with the greatest voltage value in the plurality of gate input signals c3 is selected. The voltage value of the selected gate input signal c3 is compared with the first preset voltage value, and if the voltage value of the selected gate input signal c3 is greater than the first preset voltage value, the selected gate input signal c3 is used as the sample gate input signal.

For example, as shown in FIG. 8A, each selector includes an operational amplifier S and two selection resistors R. The two selection resistors R are respectively coupled to an inverting input terminal and a non-inverting input terminal of the operational amplifier S, and the other terminals of the two selection resistors R are respectively coupled to two signal input terminals of the selector. An output terminal of the operational amplifier is an output terminal of the selector.

By providing the plurality of stages of selector groups, the signal selection unit 2511 performs a stage-by-stage selection on the received plurality of gate input signals c3, and finally selects the gate input signal c3 with the greatest voltage value. If the voltage value of the gate input signal c3 is greater than the first preset voltage value, the gate input signal c3 is used as the sample gate input signal. In the selector groups, selectors in a selector group in the same stage operate simultaneously, so that the selection time may be shortened, and efficiency may be improved.

Figure 8B:
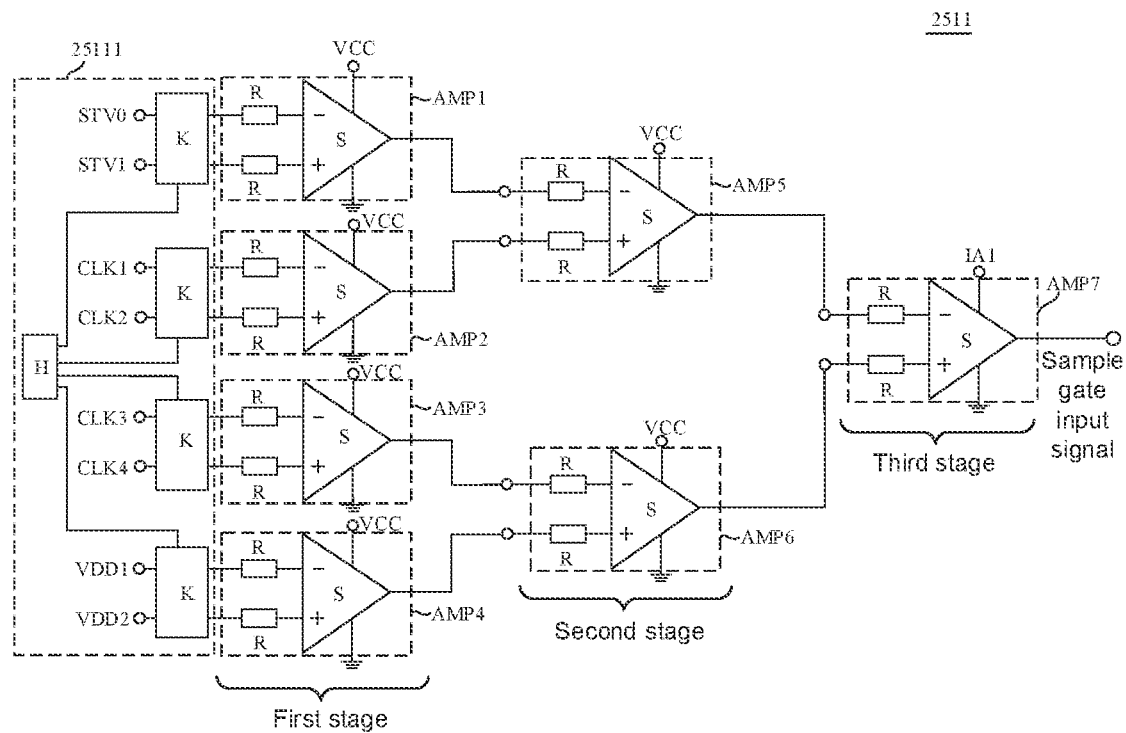
FIG. 8B is a diagram showing a structure of another signal selection unit, in accordance with some embodiments.

In some embodiments, as shown in FIG. 8B, the signal selection unit 2511 further includes a switch control sub-unit 25111. The switch control sub-unit 25111 is coupled to the selector group in the first stage, and is configured to control each selector in the selector group in the first stage to be turned on or off.

For example, as shown in FIG. 8B, in a case where the signal selection unit 2511 includes three stages of selector groups, and the selector group in the first stage includes four selectors, the switch control sub-unit 25111 includes four switch modules K and one switch signal output module H. A switch module K is coupled to a respective selector in the selector group in the first stage. The switch signal output module H is coupled to the four switch modules. The switch signal output module H is configured to output corresponding control signals to the switch modules K, so as to control the switch modules K to be turned on or off, and in turn to control selectors coupled to the switch modules K to be turned on or off.

For example, the switch module K includes a switch transistor. A control electrode of the switch transistor is coupled to an output terminal of the switch signal output module, a first electrode of the switch transistor is coupled to an input terminal of the signal selection unit, and a second electrode of the switch transistor is coupled to an input terminal of a selector in the selector group in the first stage. The switch transistor is configured to be turned on or off due to action of a control signal output by the switch signal output module, so as to control the selector in the selector group coupled thereto to be turned on or off. The control signal is a high level signal or a low level signal.

For example, in a case where the number of the plurality of gate input signals c3 is six, and the signal selection unit 2511 includes stages of selector groups, the selector group in the first stage includes four selectors, and the six gate input signals c3 need three selectors. The switch control sub-unit controls three of the four selectors to be turned on and the remaining one of the four selectors to be turned off, so that unnecessary power consumption may be saved.

Through this arrangement, multiple stages of selector groups may be provided in the signal selection unit 2511 to support detection of a large number of plate input signals c3, and by controlling the selectors in the selector group in the first stage to be turned on or off by the switch control sub-unit, selectors required to operate are turned on, and idle selectors are turned off, so that the power consumption may be saved.

It will be noted that, the circuit structure of the signal selection unit 2511 provided in the embodiments of the present disclosure is merely an example, and a specific implementation manner of the signal selection unit is not limited to the manner described above, and may be any used implementation manner, and may be, for example, a conventional connection manner well known to a person skilled in the art, as long as corresponding functions may be achieved, and the above example cannot limit the protection scope of the present disclosure.

In some embodiments, as shown in FIG. 5B, the delay determination sub-circuit 252 includes a delay unit 2521 and a determination unit 2522.

The delay unit 2521 is configured to receive the first control signal output by the sampling sub-circuit 251, delay the first control signal for the first preset time, and output the delayed first control signal.

Figure 9:
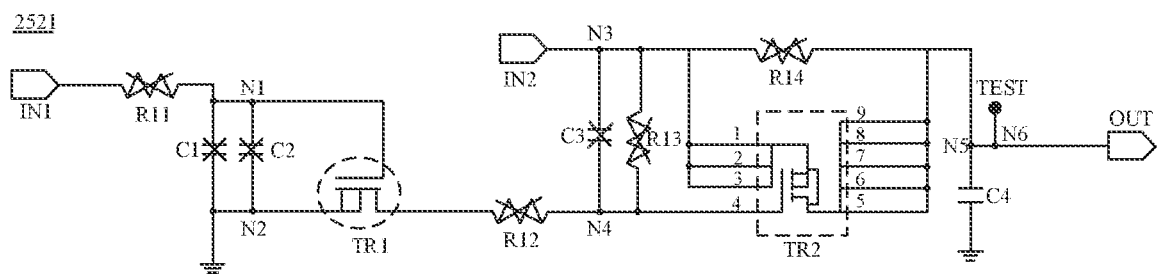
FIG. 9 is a diagram showing a structure of a delay unit, in accordance with some embodiments.

For example, as shown in FIG. 9, the delay unit 2521 includes a first input terminal IN1, a second input terminal IN2, an output terminal OUT, a first transistor TR1, a second transistor TR2, a first capacitor C1, a second capacitor C2, a third capacitor C3, a fourth capacitor C4, a first delay resistor R11, a second delay resistor R12, a third delay resistor R13 and a fourth delay resistor R14. A first end of the first delay resistor R11 is coupled to the first input terminal IN1, and a second end of the first delay resistor R11 is coupled to a first node N1. The first capacitor C1 is coupled between the first node N1 and a second node N2, and the second capacitor C2 is coupled between the first node N1 and the second node N2. The second node N2 is grounded. A control electrode of the first transistor TR1 is coupled to the first node N1, a first electrode of the first transistor TR1 is coupled to the second node N2, and a second electrode of the first transistor TR1 is coupled to a first end of the second delay resistor R12. A second end of the second delay resistor R12 is coupled to a fourth node N4.

The third capacitor C3 is coupled between a third node N3 and the fourth node N4. The second input terminal IN2 is coupled to the third node N3, The third delay resistor R13 is coupled between the third node N3 and the fourth node N4. A first end of the fourth delay resistor R14 is coupled to the third node N3, and a second end of the fourth delay resistor R14 is coupled to a fifth node N5. A control electrode of the second transistor TR2 is coupled to the fourth node N4, a first electrode of the second transistor TR2 is coupled to the third node N3, and a second electrode of the second transistor TR2 is coupled to the fifth node N5. A first end of the fourth capacitor C4 is coupled to the fifth node N5, and a second end of the fourth capacitor C4 is grounded. The fifth node N5 is coupled to a sixth node N6, and the sixth node N6 is coupled to a test point TEST and the output terminal OUT. The test point TEST is configured to test the delayed first control signal.

In some examples, the first transistor TR1 is a PNP type N-channel enhancement mode metal-oxide-semiconductor field-effect transistor (MOSFET). For example, the first transistor TR1 has following parameters: a turn-on delay time of 7 ns (a maximum value being 14 ns), a turn-on rise time of 15 ns (a maximum value being 30 ns), a turn-off delay time of 38 ns (a maximum value being 76 ns), and a turn-off fall time of 3 ns (a maximum value being 6 ns).

The second transistor TR2 is a PNP type MOSFET, and the second transistor TR2 may be used for voltage signal processing, and may also be used for current signal processing. The first electrode of the second transistor TR2 is coupled to the third node N3 through three input channels numbered 1, 2 and 3, and the second electrode of the second transistor TR2 is coupled to the fifth node N5 through five output channels numbered 5, 6, 7, 8 and 9. The channel numbered 4 is configured to transmit a reference voltage signal, so that a signal input through the channel numbered 4 may be controlled as a reference delay voltage. For example, the second transistor TR2 has following parameters: a turn-on delay time of 5.6 ns, a turn-on rise time of 18.4 ns, a turn-off delay time of 46.6 ns, and a turn-off fall time of 12 ns.

Capacitances of the first capacitor C1, the second capacitor C2 and the third capacitor C3 may be set according to a magnitude of a circuit ripple of the delay unit 2521, which are not limited in the present disclosure. For example, the capacitances of the first capacitor C1, the second capacitor C2 and the third capacitor C3 are all 10 uf to cope with the ripple of 150 mV.

For example, a resistance of the first delay resistor R11 is in a range of 0 kΩ to 50 kΩ inclusive, such as 30 kΩ; and a resistance of the second delay resistor R12 is in a range of 10 kΩ to 25 kΩ inclusive, such as 22.1 kΩ.

In the delay unit 2521, the first input terminal IN1 and the second input terminal IN2 receive the first control signal, and after the first control signal is delayed, the delayed first control signal is transmitted to the sixth node N6, and the delayed first control signal is output from the output terminal OUT and the test point TEST. By testing the delayed first control signal at the test point TEST, it may be known that, a comprehensive test result of the delayed first control signal satisfies that a pulse width is less than or equal to 300 us, and a duty cycle is less than or equal to 2%. For example, the delayed first control signal is delayed by approximately 3 μs compared with the undelayed first control signal.

It will be noted that, the circuit structure of the delay unit 2521 provided in the embodiments of the present disclosure is only an example, and in practical applications, the parameters of the first transistor TR1 and the second transistor TR2, the capacitances of the capacitors and the resistances of the resistors may be set correspondingly according to actual situations. A specific implementation manner of the delay unit 2521 is not limited to the manner described above, and may be any used implementation manner, and may be, for example, a conventional connection manner well known to a person skilled in the art, as long as corresponding functions may be achieved, and the above example cannot limit the protection scope of the present disclosure.

The determination unit 2522 is coupled to the delay unit 2521. The determination unit 2522 is configured to receive the first control signal output by the sampling sub-circuit 251 and the delayed first control signal output by the delay unit 2521, determine whether the voltage value of the first control signal before the delay is equal to the voltage value of the first control signal after the delay, and if the voltage value of the first control signal before the delay is equal to the voltage value of the first control signal after the delay, output the counting signal.

For example, as shown in FIG. 5B, the determination unit 2522 has two input terminals and one output terminal. The two input terminals are configured to receive the first control signal output by the sampling sub-circuit 251 and the delayed first control signal output by the delay unit 2521. After the determination, the counting signal is output through the output terminal.

In some embodiments, as shown in FIG. 5A, the counting control sub-circuit 253 is further configured to output the third control signal c6 if the counted number reaches the preset number, the third control signal c6 being used for the cutting off of the inputting of the signal from the signal source to the system board 1, so that the system board 1 stops receiving the video signal c7 output by the video signal source 1' according to the third control signal c6.

In this way, the system board 1 may cut off the inputting of the original signal source at source, and it is possible to improve the reliability of the overcurrent protection system of the display apparatus 100, reduce the invalid driving of the system board 1, and prevent a possible abnormal source signal from adversely affecting the system board 1.

In some embodiments, as shown in FIG. 5B, the counting control sub-circuit 253 includes a counting unit 2531 and a control unit 2532.

The counting unit 2531 is configured to receive the counting signal output by the delay determination sub-circuit 252, and perform the counting according to the counting signal.

The control unit 2532 is coupled to the counting unit 2531, and the control unit 2532 is configured to store the counted number, and output the second control signal c5 if the counted number reaches the preset number. The second control signal c5 is used for the cutting off of the inputting of the signal from the system board 1 of the display apparatus 100 to the driver circuit 2 of the display apparatus 100.

The control unit 2532 is further configured to: if the counted number does not reach the preset number, determine whether the counted number is increased within the second preset time thereafter (i.e., after the clock cycle in which it is determined that the counted number does not reach the preset number); and if the counted number is not increased within the second preset time thereafter, reset the counted number to zero. For example, the second preset time is a clock cycle T of the detection timing signal, such as 50 μs.

In some embodiments, the control unit 2532 is further configured to output the third control signal c6 if the counted number reaches the preset number. The third control signal c6 is used for the cutting off of the inputting of the signal from the signal source 1' to the system board 1.

Through the counting unit 2531 and the control unit 2532, a counting function may be achieved, and in a case where the counted number reaches the preset number, the second control signal c5 and the third control signal c6 are output. Therefore, the signal output by the system board 1 to the driver circuit 2 of the display apparatus 100 is cut off, and the driver circuit 2 and the display panel 3 are protected, and in turn, the signal output by the signal source to the system board 1 is cut off, and the system board 1 is protected.

It will be noted that, in some embodiments, the display apparatus 100 provided in the embodiments of the present disclosure may be any apparatus that displays an image whether in motion (e.g., a video) or stationary (e.g., a still image), and whether textual or graphical. More specifically, it is anticipated that the embodiments may be implemented in or associated with a variety of electronic devices. The variety of electronic devices include, (but are not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, automobile displays (e.g., odometer displays), navigators, cockpit controllers and/or displays, camera view displays (e.g., displays of rear-view cameras in vehicles), electronic photos, electronic billboards or signs, projectors, architectural structures, packagings and aesthetic structures (e.g., displays for displaying images of jewelry).

In some embodiments, the display apparatus 100 provided in the embodiments of the present disclosure may be a liquid crystal display (LCD) 100; or, the display apparatus 100 may be an electroluminescent display apparatus 100 or a photoluminescent display apparatus 100. In a case where the display apparatus 100 is the electroluminescent display apparatus 100, the electroluminescent display apparatus 100 may be an organic light-emitting diode (OLED) display apparatus or a quantum dot light-emitting diode (QLED) display apparatus. In a case where the display apparatus 100 is the photoluminescent display apparatus 100, the photoluminescent display apparatus 100 may be a quantum dot photoluminescent display apparatus 100.

Figure 10A:
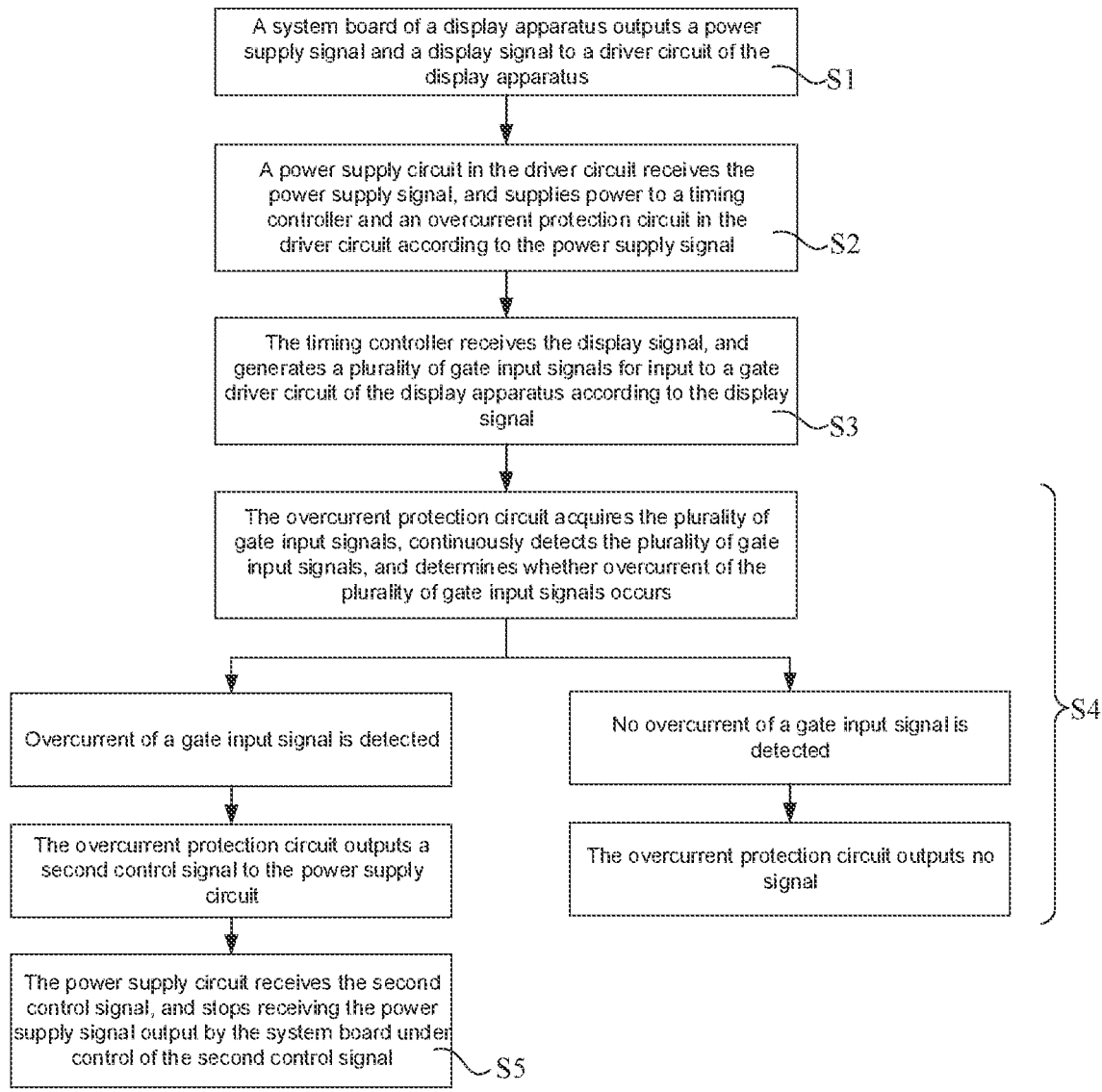
FIG. 10A is a flow diagram of an overcurrent protection method, in accordance with some embodiments.
Figure 10B:
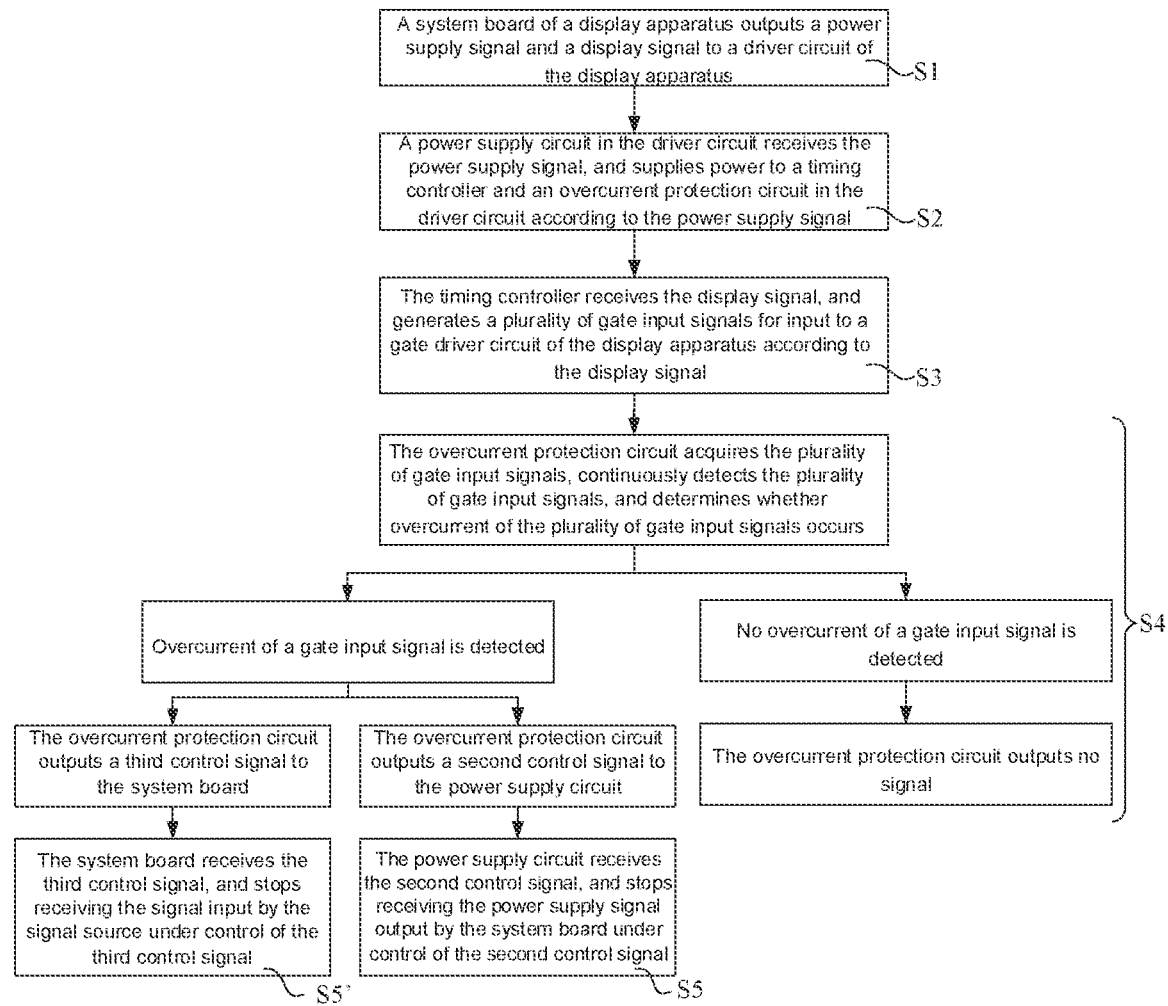
FIG. 10B is a flow diagram of another overcurrent protection method, in accordance with some embodiments.

Some embodiments of the present disclosure further provide an overcurrent protection method, which is applied to the display apparatus 100 shown in FIG. 2 provided in the embodiments of the present disclosure. As shown in FIGS. 10A and 10B, the overcurrent protection method includes the following steps.

In step 1 (S1), the system board 1 of the display apparatus 100 outputs the power supply signal c2 and the display signal c1 to the driver circuit 2 of the display apparatus 100.

In step 2 (S2), the power supply circuit 21 in the driver circuit 2 receives the power supply signal c2, and supplies power to the timing controller 22 and the overcurrent protection circuit 25 in the driver circuit 2 according to the power supply signal c2.

In some embodiments, the power supply circuit 21 further supplies power to the display panel 3, the gate driver circuit 31 and the source driver circuit 23 according to the power supply signal c2.

In step 3 (S3), the timing controller 22 receives the display signal c1, and generates the plurality of gate input signals c3 for input to the gate driver circuit 31 of the display apparatus 100 according to the display signal c1.

In some embodiments, the timing controller 22 further generates the plurality of source input signals c4 for input to a source driver circuit of the display apparatus 100 according to the display signal c1.

In step 4 (S4), the overcurrent protection circuit 25 acquires the plurality of gate input signals c3, and continuously detects the plurality of gate input signals c3.

If overcurrent of the plurality of gate input signals c3 is detected, the second control signal c5 is output to the power supply circuit 21. The second control signal c5 is used for the cutting off of the inputting of the signal from the system board 1 of the display apparatus 100 to the driver circuit 2 of the display apparatus 100.

If no overcurrent of the plurality of gate input signals c3 is detected, the overcurrent protection circuit 25 outputs no signal.

In some embodiments, as shown in FIG. 10B, S4 further includes:

if the overcurrent of the plurality of gate input signals c3 is detected, outputting, by the overcurrent protection circuit 25, the third control signal c6 to the system board 1, the third control signal c6 being used for the cutting off of the inputting of the signal from the signal source 1' to the system board 1.

For example, the overcurrent protection circuit 25 detects the plurality of gate input signals c3 once in each clock cycle T under the control of the detection timing signal shown in FIGS. 4A and 4B, so as to achieve the continuous detection. For example, in the next clock cycle (the square-wave cycle) T, when the falling edge or the rising edge of the detection timing signal arrives, the detection is performed again.

Figure 11:
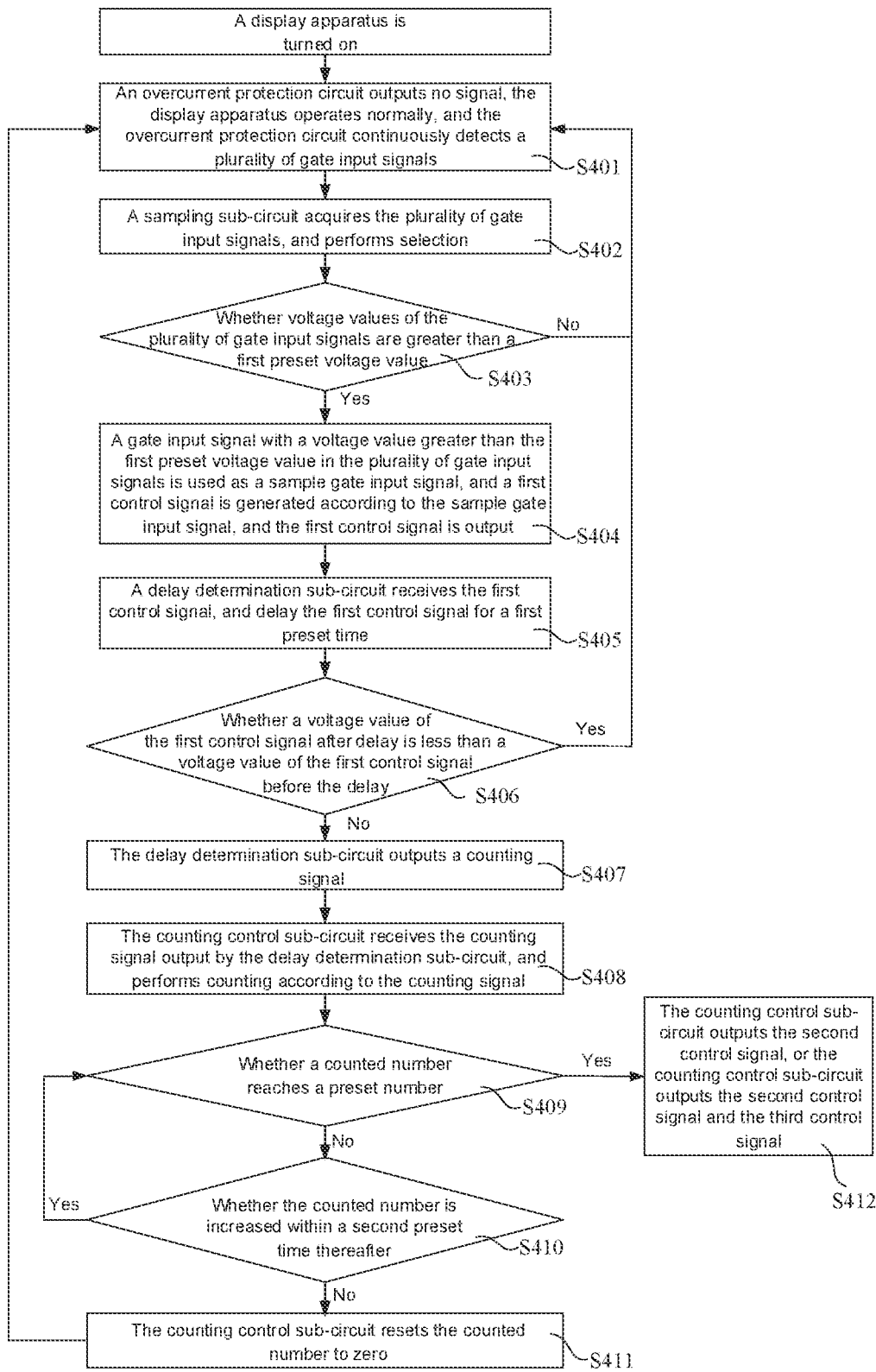
FIG. 11 is a flow diagram of yet another overcurrent protection method, in accordance with some embodiments.

Referring to FIG. 11, in some examples, a detection process of the overcurrent protection circuit 25 in S4 includes the following steps.

In step 401 (S401), the display apparatus 100 operates normally, and the overcurrent protection circuit 25 continuously detects the plurality of gate input signals c3. At this time, the overcurrent protection circuit 25 outputs no signal.

After the display apparatus 100 is turned on, the driver circuit 2 and the display panel 3 enter an operating state, and the overcurrent protection circuit 25 continuously detects the plurality of gate input signals c3 output by the timing controller. In this step, the overcurrent protection circuit 25 outputs no signal. That is, the overcurrent protection circuit 25 detects no overcurrent of the plurality of gate input signals c3. Thus, the display apparatus is in a normal operating state.

The process of detecting the plurality of gate input signals c3 by the internal components included in the overcurrent protection circuit 25 within a clock cycle T is described in the following steps 402 to 411 (S402 to S411).

In S402, the sampling sub-circuit 251 acquires the plurality of gate input signals c3, and performs the selection.

In S403, the sampling sub-circuit 251 determines whether the voltage value of the selected gate input signal c3 is greater than the first preset voltage value.

For example, in S402 and S403, the signal selection unit 2511 in the sampling sub-circuit 251 receives the plurality of gate input signals c3, selects the gate input signal c3 with the greatest voltage value in the plurality of gate input signals c3, compares the voltage value of the selected gate input signal c3 with the first preset voltage value, and determines whether the voltage value of the selected gate input signal c3 is greater than the first preset voltage value.

If the voltage of the selected gate input signal c3 is not greater than the first preset voltage, it means that no overcurrent abnormality of the plurality of gate input signals c3 occurs, and the method returns to S401 to wait for a detection in a next clock cycle.

If the voltage of the selected gate input signal c3 is greater than the first preset voltage, then S404 is performed.

In S404, the sampling sub-circuit 251 uses the gate input signal c3 with the voltage value greater than the first preset voltage value in the plurality of gate input signals c3 as the sample gate input signal, generates the first control signal according to the sample gate input signal, and outputs the first control signal.

In some example, the sampling sub-circuit 251 includes the signal selection unit 2511. The signal selection unit 2511 selects the gate input signal c3 with the voltage value greater than the first preset voltage value in the plurality of gate input signals c3 as the sample gate input signal, and outputs the sample gate input signal as the first control signal.

In some other example, the sampling sub-circuit 251 includes the signal selection unit 2511 and the signal processing unit 2512. The signal selection unit 2511 select the gate input signal c3 with the voltage value greater than the first preset voltage value in the plurality of gate input signals c3 as the sample gate input signal. The signal processing unit 2512 receives the sample gate input signal output by the signal selection unit 2511, and performs the de-interference processing and the amplification processing on the sample gate input signal, generates the first control signal according to the de-interfered and amplified sample gate input signal and the second preset voltage value, and outputs the first control signal.

In S405, the delay determination sub-circuit 252 is configured to receive the first control signal output by the sampling sub-circuit 251, and delay the first control signal for the first preset time.

In S406, the delay determination sub-circuit 252 determines whether the voltage value of the first control signal after the delay is less than the voltage of the first control signal before the delay.

For example, in a case where the sampling sub-circuit 251 includes the signal selection unit 2511, and the selected sample gate input signal is output as the first control signal, in this step, it is actually determined whether the duration for which the voltage value of the sample gate input signal is greater than the first preset voltage value is greater than the first preset time.

If the duration for which the voltage value of the sample gate input signal is greater than the first preset voltage value is greater than the first preset time, it means that the selected sample gate input signal is not a sample gate input signal with a voltage truly greater than the first preset voltage, but a sample gate input signal c3 selected in a case where a peak current occurs. Thus, the first control signal generated according to the wrong sample gate input signal may be inaccurate, and no actual overcurrent of the plurality of gate input signals c3 occurs in this case. Therefore, the method returns to S401 to wait for the detection in the next clock cycle.

If the duration for which the voltage value of the sample gate input signal is greater than the first preset voltage value is not greater than the first preset time, then S407 is performed.

In S407, the delay determination sub-circuit 252 outputs the counting signal.

In S408, the counting control sub-circuit 253 receives the counting signal output by the delay determination sub-circuit 252, and performs the counting according to the counting signal.

In S409, the counting control sub-circuit 253 determines whether the counted number reaches the preset number.

For example, the preset number is three. If the counted number reaches the preset number, it means that, in each of three consecutive clock cycles T, it is detected that a voltage value of at least one gate input signal c3 is greater than the first preset voltage value. This means that overcurrent abnormality of the gate input signals c3 occurs and lasts for at least three clock cycles T. In this case, step 412 (S412) is performed. In S412, the counting control sub-circuit 253 outputs the second control signal c5 to the power supply circuit 21; or, the counting control sub-circuit 253 outputs the second control signal c5 to the power supply circuit 21, and outputs the third control signal c6 to the system board 1.

If the counted number does not reach the preset number, it means that, the number of times of occurrences of a situation in which a voltage value of at least one gate input signal c3 is greater than the first preset voltage value is insufficient. For example, in the case where the preset number is three, if the counted number is two, then S410 is performed.

In S410, the counting control sub-circuit 253 determines whether the counted number is increased within the second preset time thereafter (i.e., after the clock cycle in which it is determined that the counted number does not reach the preset number).

For example, the second preset time is a clock cycle T, and may be, for example, 50 μs. If the counted number does not reach the preset number, t is determined whether the counted number is increased within another clock cycle after the clock cycle in which it is determined that the counted number does not reach the preset number, so as to determine whether overcurrent abnormality of the plurality of gate input signals c3 is detected again within the clock cycle T.

If the counted number is increased within the second preset time, the method returns to S409, in which the counting control sub-circuit 253 determines whether the counted number reaches the preset number.

If the counted number is not increased within the second preset time, then S411 is performed.

In S411, the counting control sub-circuit 253 resets the counted number to zero, and the method returns to S401 to wait for the detection in the next clock cycle. In this case, no overcurrent abnormality of the plurality of gate input signals c3 occurs.

After S4, the overcurrent protection method further includes steps 5 and 5' (S5 and S5').

In S5, the power supply circuit 21 receives the second control signal c5, and stops receiving the power supply signal c2 output by the system board 1 under the control of the second control signal c5.

In this way, the power supply circuit 21 stops supplying power to the timing controller 22, the gate driver circuit 31, the source driver circuit 23 and the display panel 3, so that the driver circuit 2 and the display panel 3 stop operating. As a result, the timing controller 22 is unable to generate the plurality of gate input signals c3, and is unable to provide the plurality of gate input signals c3 with overcurrent abnormality to the gate driver circuit 31, and in turn, the plurality of gate input signals c3 with the overcurrent abnormality may be cut off in time, and are not input to the gate driver circuit 31. Therefore, it is possible to prevent the plurality of gate input signals c3 with the overcurrent abnormality from adversely affecting the gate driver circuit 31, and in turn prevent the display panel 3 from being adversely affected.

In S5', the system board 1 receives the third control signal c6, and stops receiving the signal output by the signal source under the control of the third control signal c6. Therefore, it is possible to cut off the inputting of the signal source to the system board 1 at source, and further prevent a possible abnormal signal from adversely affecting the display apparatus 100.

For the overcurrent protection method applied to the display apparatus 100 provided in the embodiments of the present disclosure, the overcurrent protection circuit 25 may continuously detect the gate input signals, thereby ensuring that the overcurrent abnormality of the gate input signal c3 caused by the abnormality of the display signal c1 is detected in time. Moreover, the overcurrent protection circuit 25 outputs the second control signal c5 at the moment when the abnormality is detected, so that the power supply circuit 21 stops receiving the power supply signal c2 output by the system board 1 under the control of the second control signal c5, and in turn, the inputting of the power supply signal c2 from the system board 1 to the power supply circuit 21 is cut off, and the power supply to the display apparatus 100 is stopped. As a result, the display panel 3 and the driver circuit 2 are protected, and the display panel 3 and the driver circuit 2 are prevented from being adversely affected due to continuous operation of the display apparatus 100. Furthermore, the overcurrent protection circuit 25 outputs the third control signal c6 at the moment when the abnormality is detected, and the system board 1 stops receiving the signal output by the signal source under the control of the third control signal c6, so that it is possible to prevent a possible abnormal signal output by the signal source from adversely affecting the display apparatus 100, and protect the system board 1.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure, Therefore, the scope of the present disclosure shall be subject to the protection scope of the claims.

What is claimed is:

1. An overcurrent protection circuit, configured to continuously detect a plurality of gate input signals input to a gate driver circuit, the overcurrent protection circuit comprising:
    a sampling sub-circuit configured to: acquire the plurality of gate input signals; select a gate input signal with a voltage value greater than a first preset voltage value in the plurality of gate input signals as a sample gate input signal; and generate a first control signal according to the sample gate input signal, and output the first control signal, wherein the first preset voltage value is a critical voltage value at which a transition between a normal state and an overcurrent state of a voltage of a gate input signal occurs;
    a delay determination sub-circuit coupled to the sampling sub-circuit, the delay determination sub-circuit being configured to: receive the first control signal output by the sampling sub-circuit; delay the first control signal for a first preset time; determine whether a voltage value of the first control signal after delay is less than a voltage value of the first control signal before the delay; and if the voltage value of the first control signal after the delay is not less than the voltage value of the first control signal before the delay, output a counting signal; and
    a counting control sub-circuit coupled to the delay determination sub-circuit, the counting control sub-circuit being configured to: receive the counting signal output by the delay determination sub-circuit; perform counting according to the counting signal; and if a counted number reaches a preset number, output a second control signal, the second control signal being used for cutting off of inputting of a signal from a system board of a display apparatus to a driver circuit of the display apparatus; wherein
    the sampling sub-circuit includes a signal selection unit;
    the signal selection unit is configured to receive the plurality of gate input signals, and select the gate input signal with the voltage value greater than the first preset voltage value in the plurality of gate input signals as the sample gate input signal.

2. The overcurrent protection circuit according to claim 1, wherein the sampling sub-circuit further includes a signal processing unit coupled to the signal selection unit;
    the signal processing unit is configured to receive the sample gate input signal output by the signal selection unit, perform de-interference processing and amplification processing on the sample gate input signal, generate the first control signal according to the de-interfered and amplified sample gate input signal and a second preset voltage value, and output the first control signal; wherein
    the second preset voltage value is related to an amplification factor for performing the de-interference processing and the amplification processing on the sample gate input signal.

3. The overcurrent protection circuit according to claim 2, wherein the signal processing unit includes:
    a noise reduction sub-unit, the noise reduction sub-unit being configured to receive the sample gate input signal output by the signal selection unit, perform the de-interference processing on the sample gate input signal, and output the de-interfered sample gate input signal;
    an amplification sub-unit coupled to the noise reduction sub-unit, the amplification sub-unit being configured to receive the de-interfered sample gate input signal output by the noise reduction sub-unit, perform the amplification processing on the de-interfered sample gate input signal, and output the de-interfered and amplified sample gate input signal; and
    a comparison sub-unit coupled to the amplification sub-unit, the comparison sub-unit being configured to receive the de-interfered and amplified sample gate input signal output by the amplification sub-unit, generate the first control signal according to the de-interfered and amplified sample gate input signal and the second preset voltage value, and output the first control signal.

4. An overcurrent protection circuit, configured to continuously detect a plurality of gate input signals input to a gate driver circuit, the overcurrent protection circuit comprising:
    a sampling sub-circuit configured to: acquire the plurality of gate input signals; select a gate input signal with a voltage value greater than a first preset voltage value in the plurality of gate input signals as a sample gate input signal; and generate a first control signal according to the sample gate input signal, and output the first control signal, wherein the first preset voltage value is a critical voltage value at which a transition between a normal state and an overcurrent state of a voltage of a gate input signal occurs;
    a delay determination sub-circuit coupled to the sampling sub-circuit, the delay determination sub-circuit being configured to: receive the first control signal output by the sampling sub-circuit delay the first control signal for a first preset time; determine whether a voltage value of the first control signal after delay is less than a voltage value of the first control signal before the delay; and if the voltage value of the first control signal after the delay is not less than the voltage value of the first control signal before the delay, output a counting signal; and a counting control sub-circuit coupled to the delay determination sub-circuit, the counting control sub-circuit being configured to: receive the counting signal output by the delay determination sub-circuit perform counting according to the counting signal; and if a counted number reaches a preset number, output a second control signal, the second control signal being used for cutting off of inputting of a signal from a system board of a display apparatus to a driver circuit of the display apparatus; wherein the sampling sub-circuit includes a signal selection unit; and the signal selection unit is configured to receive the plurality of gate input signals, select a gate input signal with a greatest voltage value in the plurality of gate input signals, compare the voltage value of the selected gate input signal with the first preset voltage value, and if the voltage value of the selected gate input signal is greater than the first preset voltage value, use the selected gate input signal as the sample gate input signal.

5. The overcurrent protection circuit according to claim 4, wherein a number of the plurality of gate input signals is x, the signal selection unit includes n stages of selector groups, and a selector group in an i-th stage includes $2^{(n-i)}$ electors, wherein x is a positive integer greater than or equal to 3, n is a positive integer greater than or equal to 2, and i takes a value in a positive integer set of [1, n] in sequence;

each selector has two input terminals and one output terminal; two input terminals of a selector in a selector group in an (i+1)-th stage are coupled to output terminals of two selectors in the selector group in the i-th stage, respectively;

a selector group in a first stage is configured to acquire the plurality of gate input signals, and each selector in the selector group in the first stage is configured to receive two gate input signals in the plurality of gate input signals, and output a gate input signal with a greater voltage value in the received two gate input signals in the plurality of gate input signals;

the selector group in the (i+1)-th stage is configured to receive gate input signals output by the selector group in the i-th stage, and each selector in the selector group in the (i+1)-th stage is configured to receive two gate input signals in the gate input signals output by the selector group in the i-th stage, and output a gate input signal with a greater voltage value in the received two gate input signals in the gate input signals output by the selector group in the i-th stage;

a selector in a selector group in an n-th stage is configured to receive two gate input signals output by a selector group in an (n−1)-th stage, select a gate input signal with a greater voltage value in the two gate input signals output by the selector group in the (n−1)-th stage, compare a voltage value of the selected gate input signal with the greater voltage value output by the selector group in the (n−1)-th stage with the first preset voltage value, and if the voltage value of the selected gate input signal with the greater voltage value output by the selector group in the (n−1)-th stage is greater than the first preset voltage value, use the selected gate input signal with the greater voltage value output by the selector group in the (n−1)-th stage as the sample gate input signal.

6. The overcurrent protection circuit according to claim 5, wherein the signal selection unit further includes a switch control sub-unit;

the switch control sub-unit is coupled to the selector group in the first stage, and is configured to control each selector in the selector group in the first stage to be turned on or off.

7. The overcurrent protection circuit according to claim 1, wherein the delay determination sub-circuit includes:

a delay unit, the delay unit being configured to receive the first control signal output by the sampling sub-circuit, delay the first control signal for the first preset time, and output the delayed first control signal; and a determination unit coupled to the delay unit, the determination unit being configured to: receive the first control signal output by the sampling sub-circuit and the delayed first control signal output by the delay unit; determine whether the voltage value of the first control signal before the delay is equal to the voltage value of the first control signal after the delay; and if the voltage value of the first control signal before the delay is equal to the voltage value of the first control signal after the delay, output the counting signal.

8. The overcurrent protection circuit according to claim 1, wherein the first preset time is in a range of 3 μs to 5 μs, inclusive.

9. The overcurrent protection circuit according to claim 1, wherein the counting control sub-circuit is further configured to: if the counted number does not reach the preset number, determine whether the counted number is increased within a second preset time after a clock cycle in which it is determined that the counted number does not reach the preset number, and if the counted number is not increased within the second preset time after the clock cycle in which it is determined that the counted number does not reach the preset number, reset the counted number to zero.

10. The overcurrent protection circuit according to claim 9, wherein the overcurrent protection circuit is further configured to detect the plurality of gate input signals once in each clock cycle under control of a detection timing signal; and the second preset time is another clock cycle.

11. The overcurrent protection circuit according to claim 1, wherein the counting control sub-circuit is further configured to, if the counted number reaches the preset number, output a third control signal, the third control signal being used for cutting off of inputting of a signal from a signal source to the system board.

12. The overcurrent protection circuit according to claim 1, wherein the counting control sub-circuit includes:

a counting unit, the counting unit being configured to receive the counting signal output by the delay determination sub-circuit, and perform the counting according to the counting signal; and a control unit coupled to the count unit, the control unit being configured to store the counted number, and if the counted number reaches the preset number, output the second control signal.

13. A driver circuit of a display apparatus, the driver circuit comprising a power supply circuit, a timing controller, and an overcurrent protection circuit; wherein the overcurrent protection circuit is configured to continuously detect a plurality of gate input signals input to a gate driver circuit, and the overcurrent protection circuit includes:
- a sampling sub-circuit configured to: acquire the plurality of gate input signals; select a gate input signal with a voltage value greater than a first preset voltage value in the plurality of gate input signals as a sample gate input signal; and generate a first control signal according to the sample gate input signal, and output the first control signal, wherein the first preset voltage value is a critical voltage value at which a transition between a normal state and an overcurrent state of a voltage of a gate input signal occurs;
- a delay determination sub-circuit coupled to the sampling sub-circuit, the delay determination sub-circuit being configured to: receive the first control signal output by the sampling sub-circuit delay the first control signal for a first preset time; determine whether a voltage value of the first control signal after delay is less than a voltage value of the first control signal before the delay; and if the voltage value of the first control signal after the delay is not less than the voltage value of the first control signal before the delay, output a counting signal; and
- a counting control sub-circuit coupled to the delay determination sub-circuit, the counting control sub-circuit being configured to: receive the counting signal output by the delay determination sub-circuit perform counting according to the counting signal; and if a counted number reaches a preset number, output a second control signal, the second control signal being used for cutting off of inputting of a signal from a system board of a display apparatus to a driver circuit of the display apparatus;

the power supply circuit is coupled to the system board of the display apparatus, the timing controller and the overcurrent protection circuit, and the power supply circuit is configured to receive a power supply signal output by the system board, and supply power to the timing controller and the overcurrent protection circuit according to the power supply signal;

the timing controller is further coupled to the system board, and the timing controller is configured to receive a display signal output by the system board, and generate the plurality of gate input signals for input to the gate driver circuit of the display apparatus according to the display signal;

the overcurrent protection circuit is further coupled to the timing controller; and the power supply circuit is further configured to receive the second control signal output by the overcurrent protection circuit, and stop receiving the power supply signal output by the system board under control of the second control signal.

14. The driver circuit according to claim 13, further comprising a source driver circuit; wherein
the source driver circuit is coupled to the power supply circuit and the timing controller;
the timing controller is further configured to generate a plurality of source input signals for input to the source driver circuit according to the display signal; and
the source driver circuit is configured to receive the plurality of source input signals, and generate data signals according to the plurality of source input signals.

15. A display apparatus, comprising:
the driver circuit according to claim 14;
the system board, the system board being coupled to the power supply circuit and the timing controller in the driver circuit, and being configured to output the power supply signal and the display signal; and
a display panel coupled to the driver circuit; wherein
the display panel includes the gate driver circuit coupled to the timing controller and the power supply circuit in the driver circuit; and the gate driver circuit is configured to receive the plurality of gate input signals output by the timing controller, generate gate scanning signals according to the plurality of gate input signals, and output the gate scanning signals.

16. The display apparatus according to claim 15, wherein the overcurrent protection circuit in the driver circuit is further configured to output a third control signal, and the system board is further coupled to the overcurrent protection circuit in the driver circuit;
the system board is further configured to receive the third control signal, and stop receiving a signal output by a signal source under control of the third control signal.

17. An overcurrent protection method, applied to the display apparatus according to claim 16, the overcurrent protection method comprising:
outputting, by the system board of the display apparatus, the power supply signal and the display signal to the driver circuit of the display apparatus;
receiving, by the power supply circuit in the driver circuit, the power supply signal;
supplying, by the power supply circuit in the driver circuit, power to the timing controller and the overcurrent protection circuit in the driver circuit;
receiving, by the timing controller, the display signal;
generating, by the timing controller, the plurality of gate input signals for input to the gate driver circuit of the display apparatus according to the display signal;
acquiring, by the overcurrent protection circuit, the plurality of gate input signals;
continuously detecting, by the overcurrent protection circuit, the plurality of gate input signals;
if overcurrent of a gate input signal is detected, outputting, by the overcurrent protection circuit, the second control signal to the power supply circuit;
receiving, by the power supply circuit, the second control signal; and
under control of the second control signal, the power supply circuit stopping receiving the power supply signal output by the system board.

18. The overcurrent protection method according to claim 17, further comprising:
continuously detecting, by the overcurrent protection circuit, the plurality of gate input signals;
if the overcurrent of the gate input signal is detected, outputting, by the overcurrent protection circuit, a third control signal to the system board;
receiving, by the system board, the third control signal; and
under control of the third control signal, the system board stopping receiving a signal output by a signal source.

* * * * *